US011075077B2

(12) United States Patent
Fujikura et al.

(10) Patent No.: US 11,075,077 B2
(45) Date of Patent: Jul. 27, 2021

(54) NITRIDE SEMICONDUCTOR TEMPLATE AND NITRIDE SEMICONDUCTOR DEVICE

(71) Applicants: SCIOCS COMPANY LIMITED, Hitachi (JP); SUMITOMO CHEMICAL COMPANY, LIMITED, Tokyo (JP); MIE UNIVERSITY, Tsu (JP)

(72) Inventors: Hajime Fujikura, Hitachi (JP); Taichiro Konno, Hitachi (JP); Hideto Miyake, Tsu (JP)

(73) Assignees: SCIOCS COMPANY LIMITED, Hitachi (JP); SUMITOMO CHEMICAL COMPANY LIMITED, Tokyo (JP); MIE UNIVERSITY, Tsu (JP)

(*) Notice: Subject to any disclaimer, the term of this patent is extended or adjusted under 35 U.S.C. 154(b) by 32 days.

(21) Appl. No.: 15/832,442

(22) Filed: Dec. 5, 2017

(65) Prior Publication Data

US 2018/0158681 A1 Jun. 7, 2018

(30) Foreign Application Priority Data

Dec. 6, 2016 (JP) .............................. JP2016-236874

(51) Int. Cl.
*C30B 29/40* (2006.01)
*H01L 21/00* (2006.01)
(Continued)

(52) U.S. Cl.
CPC ........ *H01L 21/02502* (2013.01); *C30B 25/02* (2013.01); *C30B 25/186* (2013.01);
(Continued)

(58) Field of Classification Search
CPC .......... Y10T 428/24612; C30B 29/403; H01L 21/0243; H01L 21/02458; H01L 21/0254;
(Continued)

(56) References Cited

U.S. PATENT DOCUMENTS 8,926,752 B2* 1/2015 Koukitu ................. C30B 25/18
117/89
2011/0049544 A1* 3/2011 Komada ............. H01L 21/0242
257/97
(Continued)

FOREIGN PATENT DOCUMENTS

JP 2018-56551 A 4/2018
WO WO 2009/154215 A1 12/2009
(Continued)

OTHER PUBLICATIONS

Fujita et al. "HVPE growth of thick AlN on trench-patterned substrate", Phys. Status Solidi C 8, No. 5, 1483-1486, (2011).
(Continued)

*Primary Examiner* — Joanna Pleszczynska
(74) *Attorney, Agent, or Firm* — Birch, Stewart, Kolasch & Birch, LLP

(57) ABSTRACT

There is provided a method for manufacturing a nitride semiconductor template constituted by forming a nitride semiconductor layer on a substrate, comprising: (a) preparing a pattern-substrate as the substrate, with a concavo-convex pattern formed on a front surface of the pattern-substrate, (b) forming a first layer by epitaxially growing a nitride semiconductor containing aluminum on the concavo-convex pattern of the pattern-substrate, in a thickness of not flattening a front surface; (c) applying annealing to the first layer; and (d) forming a second layer by epitaxially growing a nitride semiconductor containing aluminum so as to overlap on the first layer after performing (c), and in a thickness
(Continued)

of flattening a front surface, and constituting the nitride semiconductor layer by the first layer and the second layer.

5 Claims, 7 Drawing Sheets

(51) Int. Cl.
| | |
|---|---|
| H01L 21/02 | (2006.01) |
| H01L 33/20 | (2010.01) |
| H01L 33/22 | (2010.01) |
| B32B 3/30 | (2006.01) |
| H01L 21/324 | (2006.01) |
| C30B 29/68 | (2006.01) |
| C30B 25/02 | (2006.01) |
| C30B 33/02 | (2006.01) |
| C30B 25/18 | (2006.01) |
| H01L 33/00 | (2010.01) |

(52) U.S. Cl.
CPC .......... *C30B 29/403* (2013.01); *C30B 29/68* (2013.01); *C30B 33/02* (2013.01); *H01L 21/0242* (2013.01); *H01L 21/0243* (2013.01); *H01L 21/0254* (2013.01); *H01L 21/0262* (2013.01); *H01L 21/02378* (2013.01); *H01L 21/02458* (2013.01); *H01L 21/02516* (2013.01); *H01L 21/02694* (2013.01); *H01L 21/3245* (2013.01); *H01L 33/007* (2013.01); *H01L 33/20* (2013.01)

(58) Field of Classification Search
CPC ......... H01L 33/20; H01L 33/12; H01L 33/22; B32B 3/30
See application file for complete search history.

(56) References Cited

U.S. PATENT DOCUMENTS

| | | | |
|---|---|---|---|
| 2011/0095327 A1 | 4/2011 | Shinohara et al. | |
| 2011/0101307 A1* | 5/2011 | Lee | H01L 21/0237 257/22 |
| 2012/0187445 A1* | 7/2012 | Oh | H01L 21/0237 257/99 |
| 2012/0258286 A1 | 10/2012 | Amano et al. | |
| 2013/0277684 A1 | 10/2013 | Araki et al. | |
| 2014/0134775 A1* | 5/2014 | Yang | H01L 33/12 438/47 |
| 2014/0185639 A1* | 7/2014 | Faurie | H01S 5/3013 372/44.01 |
| 2015/0214428 A1* | 7/2015 | Fujimori | H01L 33/20 257/98 |
| 2015/0340558 A1* | 11/2015 | Lee | H01L 33/22 257/13 |
| 2015/0372190 A1 | 12/2015 | Hirayama | |
| 2016/0190387 A1* | 6/2016 | Sun | H01L 21/02458 438/47 |
| 2018/0083163 A1 | 3/2018 | Saito et al. | |

FOREIGN PATENT DOCUMENTS

| | | |
|---|---|---|
| WO | WO 2011/077541 A1 | 6/2011 |
| WO | WO 2012/090818 A1 | 7/2012 |
| WO | WO 2014/069235 A1 | 5/2014 |

OTHER PUBLICATIONS

Miyake et al. "Annealing of an AlN buffer layer in N2-CO for growth of a high-quality AlN film on sapphire", Applied Physics Express 9, 025501, (2016).

* cited by examiner

NITRIDE SEMICONDUCTOR TEMPLATE AND NITRIDE SEMICONDUCTOR DEVICE

BACKGROUND

Technical Field

The present disclosure relates to a method for manufacturing a nitride semiconductor template, a nitride semiconductor template, and a nitride semiconductor device.

Description of the Related Art

For a light emitting diode (LED), it is proposed to realize a higher-quality (reduced dislocation) crystal in the nitride semiconductor layer and an improvement of a light-extraction efficiency by constituting LED in such a manner that a concavo-convex pattern is formed on a front surface of a substrate and a nitride semiconductor layer is laminated on the concavo-convex pattern (see non-patent document 1, for example).
Non-patent document 1: H. Miyake et al., "HVPE growth of thick AlN on trench-patterned substrate", Phys Status Solidi C 8, No. 5, 1483-1486 (2011)

SUMMARY

For example, a nitride semiconductor template having a nitride semiconductor film containing aluminum (Al) is sometimes used for LED (simply referred to as an "ultraviolet LED" hereafter) emitting light in an ultraviolet wavelength range, as a base substrate. Such a nitride semiconductor template is constituted by forming the nitride semiconductor film containing Al (for example, aluminum nitride (AlN) film) having a thickness of several 100 nm to several 10 μm on a heterogeneous substrate such as a sapphire substrate or a silicon carbide (SiC) substrate.

However, in such a nitride semiconductor template, it is not always easy to suppress an increase of a film thickness and reduce dislocations of a nitride semiconductor film containing Al formed on the concavo-convex pattern, when it is formed on a front surface of the sapphire substrate or SiC substrate, etc.

An object of the present disclosure is to provide a technique of easily obtaining a high-quality nitride semiconductor template and a nitride semiconductor device using this template, even when the concavo-convex pattern is formed on the substrate.

According to an aspect of the present disclosure, there is provided a method for manufacturing a nitride semiconductor template constituted by forming a nitride semiconductor layer on a substrate, including:

(a) preparing a pattern-substrate as the substrate, with a concavo-convex pattern formed on a front surface of the pattern-substrate, (b) forming a first layer by epitaxially growing a nitride semiconductor containing aluminum on the concavo-convex pattern of the pattern-substrate, in a thickness of not flattening a front surface;

(c) applying annealing to the first layer; and (d) forming a second layer by epitaxially growing a nitride semiconductor containing aluminum so as to overlap on the first layer after performing (c), and in a thickness of flattening a front surface, and constituting the nitride semiconductor layer by the first layer and the second layer.

According to another aspect of the present disclosure, there is provided a nitride semiconductor template having a nitride semiconductor layer formed on a substrate, wherein the substrate is a pattern-substrate having a concavo-convex pattern formed on a front surface, the nitride semiconductor layer including:

a first layer formed on the concavo-convex pattern of the pattern-substrate, in a thickness of not flattening a front surface, and made of a nitride semiconductor containing aluminum; and a second layer formed so as to overlap on the first layer, in a thickness of flattening a front surface, and made of a nitride semiconductor containing aluminum.

According to the present disclosure, the high-quality nitride semiconductor template and the nitride semiconductor device using this template can be obtained easily, even when the concavo-convex pattern is formed on the substrate.

DETAILED DESCRIPTION OF THE PRESENT DISCLOSURE

<Knowledge Obtained by Inventors>

Figure 1:
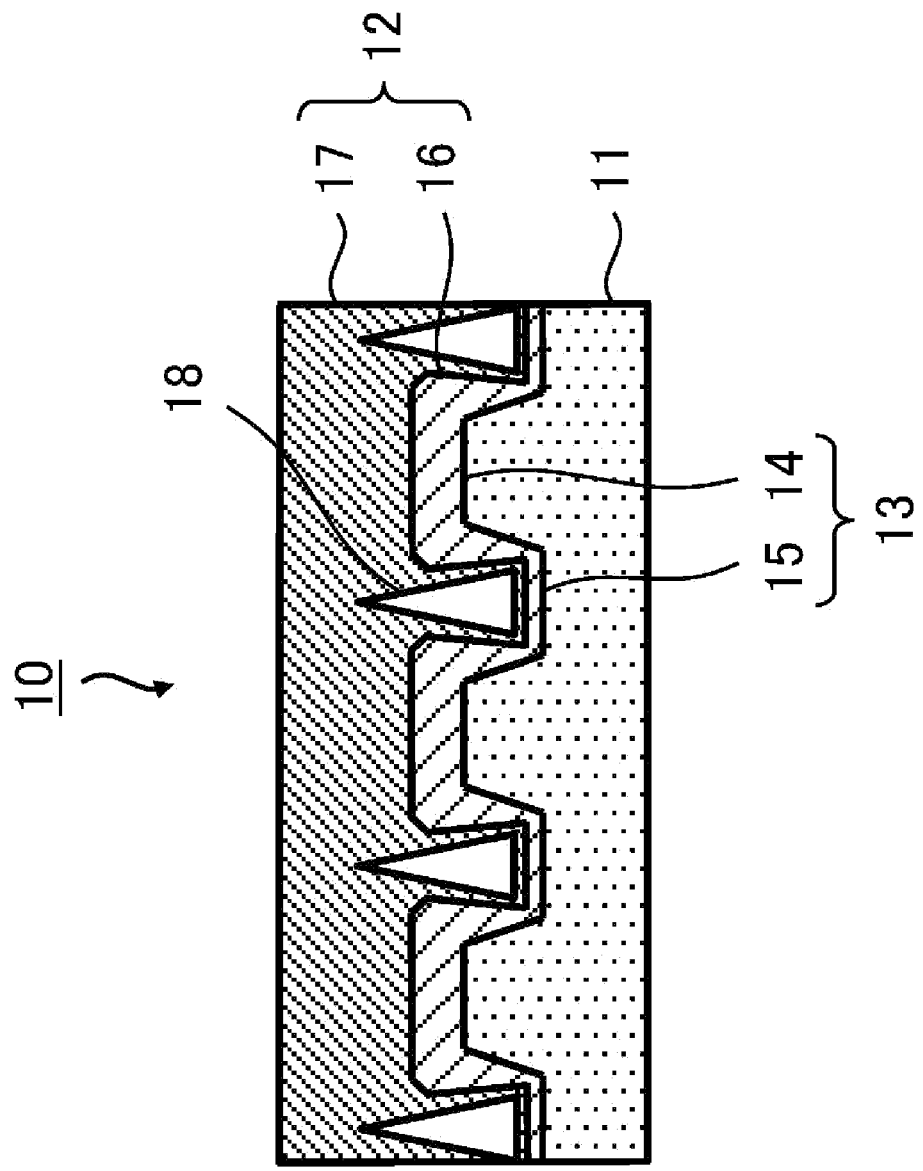
FIG. 1 is a cross-sectional view showing a schematic constitution example of a nitride semiconductor template according to an embodiment of the present disclosure.

For example, in manufacturing LED, it is an extremely effective method to constitute LED by forming a concavo-convex pattern on a front surface of a substrate and laminating a nitride semiconductor layer on this concavo-convex pattern, in order to realize a higher-quality (reduced dislocation) crystal of the nitride semiconductor layer and an improvement of a light-extraction efficiency (see non-patent document 1 for example). A technique regarding such reduced dislocations, etc., is extremely effective in a case that the nitride semiconductor layer grown on the concavo-convex pattern is gallium nitride (GaN) layer.

However, it is not always easy to apply such a method to the nitride semiconductor template used in a case of constituting the ultraviolet LED and having a layer made of a nitride semiconductor containing aluminum (Al) as a constituent element (specifically, aluminum nitride (AlN), indium aluminum nitride (AlInN), aluminum gallium nitride (AlGaN), or aluminum gallium indium nitride (AlInGaN), etc., which are represented by $In_{1-x-y}Al_xGa_yN$ ($0 \leq x+y \leq 1$, $0 < x \leq 1$, $0 \leq y \leq 1$)). This is because a surface migration of Al atom is extremely weak as compared with a migration of gallium (Ga) when GaN is grown. Therefore, when the layer made of a nitride semiconductor containing Al is grown on the concavo-convex pattern of the surface of the substrate, a meet and a disappearance of the dislocations hardly occurs during a growth as compared with a case of the layer not containing Al, in order to achieve sufficient reduced dislocations, there is no choice but to take a method of widening a reduced dislocations domain by increasing each concavo-convex cycle of the concavo-convex pattern to 10 μm or more for example, and by sufficiently thickly growing and laterally growing the nitride semiconductor film which is formed on tops of concavo-convex portions in an initial stage of the growth. In this case, there is also a problem that for example a thickness 20 μm or more must be grown in order to obtain a flat front surface by combining adjacent nitride semiconductor films which are disposed in island-shapes. There is a necessity for decreasing each concavo-convex cycle of the concavo-convex pattern to about several μm in order to flatten the front surface of the nitride semiconductor film by more decreasing a film thickness. However, in this case, an effect of reduced dislocations cannot be sufficiently obtained.

Namely, in the nitride semiconductor template having the nitride semiconductor layer containing Al, it is not always easy to suppress the increase of the film thickness and reduce dislocations of the nitride semiconductor layer containing Al formed on the concavo-convex pattern, when it is formed on the front surface of the substrate.

Incidentally, in a case of using a flat substrate in which the concavo-convex pattern is not formed, it is proposed to apply annealing to a thin AlN film which is an example of the nitride semiconductor layer containing Al formed on the flat substrate, as a method for reducing the dislocations of the nitride semiconductor layer containing Al (for example, H. Miyake et al., "Annealing of an AlN buffer in $N_2$—CO for growth of a high-quality AlN film on sapphire", Applied Physics Express 9,025501 (2016)). Specifically, such a document discloses as follows: the sapphire substrate having a flat front surface is prepared, and the AlN film having the same flat front surface as the substrate is grown on the sapphire substrate, and thereafter the substrate and the AlN film are subjected to annealing at a high temperature of 1600° C. or more in $N_2$—CO mixing atmosphere, and thereby a dislocation density of the AlN film is decreased to $1 \times 10^8$ numbers/cm² level.

However, in a case that the method for reducing the dislocations by annealing is applied to the nitride semiconductor template having the substrate in which the concavo-convex pattern is formed, it is found that there is a problem that cracks are sometimes generated in the nitride semiconductor layer after annealing when the nitride semiconductor layer is grown in a sufficient thickness for flattening the front surface of the nitride semiconductor layer containing Al before annealing. Specifically, although depending on the height of the concavo-convex pattern, there is a problem that cracks are sometimes generated in the nitride semiconductor layer, when the nitride semiconductor layer having the thickness of more than 800 nm which is a sufficient thickness for flattening the front surface, is grown on the concavo-convex pattern having a height of 400 nm or more which is a height of giving an effect of sufficiently improving the light-extraction efficiency in a case of constituting LED for example. The same thing can be said for a case that annealing is applied not in $N_2$—CO mixing atmosphere but in nitrogen ($N_2$) gas atmosphere.

In view of these circumstances, and as a result of diligent studies by the present inventors, the following new knowledge is obtained. Namely, even on the substrate on which the concavo-convex pattern is formed, the nitride semiconductor layer containing Al is formed once in a thickness of not flattening the front surface, and annealing is applied at a high temperature in $N_2$ gas atmosphere in this stage, and thereafter the nitride semiconductor layer containing Al is grown for flattening the front surface, to thereby suppress the increase of a film thickness and reduce the dislocations of the nitride semiconductor layer without generating cracks, so that the dislocation density on the front surface of the nitride semiconductor layer can be $1 \times 10^9$ numbers/cm² or less.

The present disclosure is based on the abovementioned new knowledge found by the present inventors.

<An Embodiment of the Present Disclosure>

An embodiment of the present disclosure will be described hereafter, with reference to the drawings.

(1) Constitution of a Nitride Semiconductor Template

First, an explanation will be given for a schematic constitution example of a nitride semiconductor template of this embodiment.

FIG. 1 is a cross-sectional view showing the schematic constitution example of the nitride semiconductor template of this embodiment.

The nitride semiconductor template 10 (also referred to as template 10 hereafter) exemplified in this embodiment is used as a base substrate when a semiconductor device such as LED is manufactured, and is constituted as a substrate-shaped structure body. Specifically, the template 10 is constituted including a substrate 11 and a nitride semiconductor layer 12.

(Substrate)

The substrate 11 functions as a supporting substrate for supporting the nitride semiconductor layer 12. Hereafter, an upper surface (a nitride semiconductor layer 12-side surface) of the substrate 11 is referred to as "a front surface (or a first main surface)", and a lower surface of the substrate 11 located on an opposite side thereof is referred to as "a back surface (or a second main surface)".

For example, the substrate 11 is constituted of a sapphire ($Al_2O_3$) substrate, and is constituted as a pattern-substrate in which a concavo-convex pattern 13 (also referred to as a pattern 13 hereafter) is formed on the front surface. The pattern 13 is constituted by cyclically arranging convex portions 14 which are protruded toward a nitride semiconductor layer 12 and concave portions 15 which are recessed toward a back surface reversely to the convex portions 14. Namely, the pattern 13 has a two-dimensional cyclical structure of the convex portions 14 and the concave portions 15.

Figure 2:
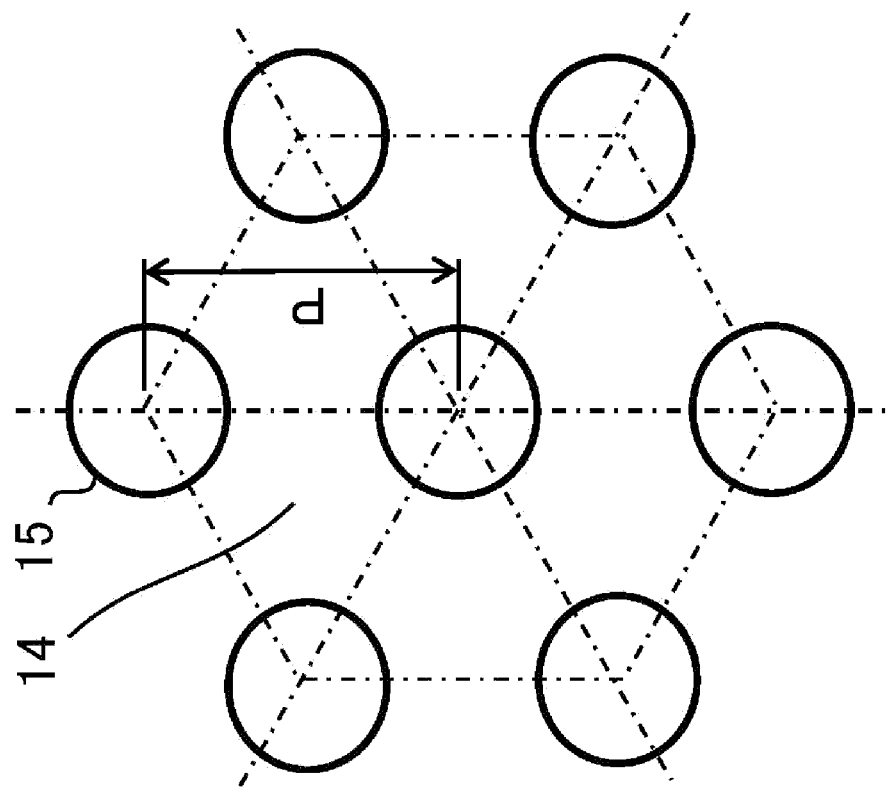
FIG. 2 is a planar view showing a specific example of a cyclical structure of a concavo-convex pattern of a substrate constituting the nitride semiconductor template according to an embodiment of the present disclosure.

FIG. 2 is a planar view showing a specific example of a cyclical structure of a concavo-convex pattern of a substrate constituting the nitride semiconductor template of this embodiment.

In this embodiment, an explanation will be given for an example of a pattern in which upper surfaces of convex portions 14 of the pattern 13 form a continuous flat surface, as the pattern 13. Namely, the pattern 13 exemplified in this embodiment is constituted so that the upper surfaces of the convex portions 14 form the continuous flat surface so that it is formed as the front surface of the substrate 11.

The upper surface of the convex portion 14 used for the front surface of the substrate 11 is a surface formed into a mirror surface, with a surface constituted of C-plane ((0001) plane) or a surface inclined by 0.1 to 3° in a-axis direction or m-axis direction from C-plane, namely this is a so-called epi-ready surface on which a group-III nitride semiconductor can be epitaxially grown. Specifically, a root-mean-square roughness (RMS) on the upper surface of the convex portion 14 is for example 10 nm or less, preferably 1 nm or less. The term "RMS" used in this specification means a value obtained by analyzing an image having a size of 5 µm×5 µm using an atomic force microscope (AFM). The back surface of the substrate 11 is not particularly limited. It is conceivable that the back surface of the substrate 11 is formed into a so-called lap-surface which is a rough surface having random irregularities for example, and also may be a mirror surface.

In contrast, the concave portion 15 of the pattern 13 is constituted by a non-through-hole whose shape in a planar view from a front surface side of the substrate 11 is a circular shape, for example. A plurality of the concave portions 15 are arranged so as to be a six-fold symmetry in a planar view for example. Specifically, the concave portions 15 are arranged so as to locate at each vertex and center of a regular hexagon.

By thus arranging the concave portions 15, the pattern 13 is formed into a pattern having a symmetry in a planar view. Further, the concave portions 15 constitute the two-dimensional cyclical structure by arranging each concave portion 15 at uniform pitch P. Each cycle of the cyclical structure, namely, the pitch P between adjacent concave portions 15 is for example 3 µm or less, more preferably 0.5 to 2 µm which is about a wavelength of light. Further, a formation depth of the concave portion 15 (a distance from the upper surface of the convex portion 14 to a bottom surface of the concave portion 15) is not more than each cycle of the cyclical structure. Further, centers of the adjacent circular concave portions 15 are respectively arranged in a direction almost parallel to m-axis direction or a-axis direction of the substrate 11. Further, a diameter of an opening of the concave portion 15 at the same level as the upper surface of the convex portion 14 is preferably about 20 to 60% of the pitch P.

The substrate 11 with such a pattern 13 having a diameter of for example 2 to 8 inches, is used. Thereby, the template 10 corresponds to a large substrate size having a diameter of more than 1 inch. Further, a thicker substrate 11 is more preferable as a diameter of a wafer is more increased, from a viewpoint of suppressing an occurrence of warpage of a wafer after a LED-structure is laminated. For example, it is conceivable that the thickness of the substrate 11 is set to 300 µm to 2 mm.

(Nitride Semiconductor Layer)

Further, in FIG. 1, the nitride semiconductor layer 12 is a layer made of a nitride semiconductor containing aluminum (Al), and formed on the pattern 13 of the substrate 11. Aluminum nitride (AlN) is exemplified as the nitride semiconductor containing Al. However, this embodiment is not limited thereto. Namely, in addition to AlN, the nitride semiconductor containing Al may be indium aluminum nitride (AlInN), aluminum gallium nitride (AlGaN), or aluminum gallium indium nitride (AlInGaN), as long as it is represented by $In_{1-x-y}Al_xGa_yN$ ($0 \le x+y \le 1$, $0 < x \le 1$, $0 \le y \le 1$).

Further, the nitride semiconductor layer 12 is constituted in a two-layer structure of a first layer 16 (also referred to as a layer 16 hereafter) located on a side facing the substrate 11 and a second layer 17 (also referred to as a layer 17 hereafter) formed so as to overlap on the layer 16. The layer 16 is formed so that an upper portion of the convex portion 14 and a bottom portion of the concave portion 15 may be connected or may not be connected with each other on a slant surface/a side surface as a boundary between the convex portion 14 and the concave portion 15 of the pattern 13 as shown in FIG. 1. For example, there is a case in which the nitride semiconductor layer 12 is hardly grown on the slant surface of the boundary of the pattern 13 like a case that the boundary of the pattern 13 is formed into a steep shape or an over-hanged shape, at an angle of for example 80 to 120° with respect to the surface of the substrate 11. This case corresponds to the above latter case.

The layer 16 and the layer 17 constituting the nitride semiconductor layer 12, are distinguished from each other depending on a difference of an impurity concentration. For example, a larger amount of oxygen (O) as an impurity is contained in the layer 16 close to a substrate 11-side than the layer 17, when the impurity concentrations of the layer 16 and the layer 17 are compared based on analysis results obtained by a secondary ion mass spectrometry (SIMS).

Such a difference in the oxygen concentrations between the layer 16 and the layer 17 occurs due to a difference of crystallinity of the nitride semiconductor containing Al during a growth of each layer. Namely, since there is an increased dislocation density in the nitride semiconductor containing Al when the layer 16 is grown, a large amount of oxygen is taken in the layer 16 by diffusion from the substrate 11-side or by mixing from a growth atmosphere during the growth. Its concentration is about $1 \times 10^{18}$ to $1 \times 10^{21}/cm^3$ for example. In contrast, the high-quality layer 16 (the reduced dislocation layer 16) to be a base is realized by annealing described later at a start of a growth of the layer 17, and therefore the layer is also a reduced dislocation layer made of nitride semiconductor containing Al. Therefore, although oxygen is slightly diffused from the layer 16 during the growth of the layer 17, a taking-in of oxygen in the layer 17 is suppressed as a whole. Although an oxygen concentration of the layer 17 depends on an atmosphere in a growth apparatus, it is typically $1 \times 10^{18}/cm^3$ or less for example.

Therefore, in the nitride semiconductor layer 12, by measuring impurity concentrations, it is possible to identify the two-layer structure of the layer 16 and the layer 17, and further it is possible to identify an existence position of an interface between the layer 16 and the layer 17. It is conceivable that the measurement of the impurity concentration is performed using a result obtained by SIMS analysis for example. However, other publicly known method can also be used.

(First Layer)

The layer 16 being one of the layers constituting the two-layer structure is a layer formed by epitaxially growing the nitride semiconductor containing Al on the pattern 13 of the substrate 11, and is a layer subjected to annealing in an inert gas atmosphere, as described in detail later.

The layer 16 is formed in a thickness of not flattening its front surface. Here, a thickness of not flattening a front surface indicates a thickness of not completely embedding the concave portion 15 by the layer 16 even when the layer 16 formed on the pattern 13 is obliquely facet-grown on the concave portion 15 of the pattern 13. Here, such an oblique facet-growth indicates that a crystal growth of a surface (facet) different from a growth surface (C-plane) is carried out in an oblique direction.

Specifically, the layer 16 is formed in the following thickness as the thickness of not flattening its front surface. Namely, the layer 16 is formed so that the layer 16 in the upper surface of the convex portion 14 of the pattern 13 has a thickness of forming the layer 16 as a continuous film and of not allowing cracks to be generated in the layer 16. For example, the layer 16 is formed in the thickness of 100 to 800 nm. When the thickness of the layer 16 is less than 100 nm, there is a problem that it may not become the continuous film. By setting the thickness of the layer 16 to 100 nm or more, it can be formed as the continuous film. Further, when the thickness of the layer 16 is more than 800 nm, there is a problem that cracks may be generated during formation of the layer 16 or annealing thereafter. By setting the thickness of the layer 16 to 800 nm or less, it can be formed so that cracks are not generated.

Further, in the layer 16, the dislocations of the front surface (namely, a surface which faces the upper surface of the convex portion 14 of the pattern 13 and which is a layer 17-side surface), are reduced by applying annealing. Specifically, for example, the layer 16 has an average dislocation density of $1 \times 10^9$ numbers/cm$^2$ or less on the front surface. Further, for example, the layer 16 has a half-value width (a full width of half maximum) of 600 second or less, more preferably 400 seconds or less in (10-12) diffraction obtained by X-ray rocking curve (XRC) measurement for the front surface using X-ray diffraction (XRD).

(Second Layer)

The layer 17 being the other layer constituting the two-layer structure is a layer formed by epitaxially growing the nitride semiconductor containing Al so as to overlap on the layer 16 and cover the front surface side of the layer 16 as described in detail later.

The layer 17 is formed in a thickness of flattening its front surface. Here, a thickness of flattening a front surface indicates a thickness formed so that concave portions of concavo-convex portions left on the front surface of the layer 16, are completely embedded by the layer 17 to be formed so as to overlap on the layer 16 and the front surface of the layer 17 becomes a flat surface.

Specifically, the layer 17 is formed in the following thickness as the thickness of flattening the front surface. Namely, the layer 17 is formed so that a total thickness of the layer 16 and the layer 17 (specifically, a thickness from the upper surface of the convex portion 14 of the pattern 13 to an outermost surface of the nitride semiconductor layer 12) exceeds at least 800 nm (more than 800 nm) for example, when the concavo-convex pattern has a height of 400 nm or more which is a height of giving an effect of sufficiently improving the light-extraction efficiency in a case of constituting LED for example. The thickness of flattening the front surface of the layer 17 can be obtained, when the total thickness of the layer 16 and the layer 17 is more than 800 nm.

Further, it is preferable to form the layer 17 so that the total thickness of the layer 16 and layer 17, namely a thickness from the upper surface of the convex portion 14 of the pattern 13 forming the continuous flat surface to the front surface (flattened surface) of the layer 17 is 5 μm or less for example, for suppressing the increase of the thickness of the nitride semiconductor layer 12 constituted of the layer 16 and layer 17 as much as possible.

By forming the layer 17 so as to flatten the front surface, the layer 17 includes for example a trigonal pyramid shaped void (hollow) 18 at a portion facing the bottom surface of the concave portion 15 of the pattern 13.

Further, the layer 17 is a layer in which dislocations are reduced similar to the layer 16, because it is formed on the layer 16 in which the dislocations are reduced. Specifically, for example, the layer 17 has an average dislocation density of $1 \times 10^9$ numbers/cm$^2$ or less on the front surface (namely, the flattened surface).

In addition, since the layer 17 is grown so as to overlap on the layer 16, a roughness of the front surface of the layer 17 is also improved as compared with a case of the layer 16 only. Specifically, the layer 17 has a surface roughness RMS (also simply referred to as RMS hereafter) of 10 nm or less, more preferably 1 nm or less on the front surface. Further, the layer 17 has a half-value width of 600 seconds or less, more preferably 400 seconds or less in (10-12) diffraction obtained by XRC measurement for the front surface.

(2) A Method for Manufacturing a Nitride Semiconductor Template

Next, an explanation will be given for a procedure for manufacturing the template 10 having the abovementioned constitution, namely, a method for manufacturing the nitride semiconductor template of this embodiment.

(Constitution Example of a Growth Apparatus)

Here, first, an explanation will be given for a constitution example of a growth apparatus used for manufacturing the template 10.

Figure 3:
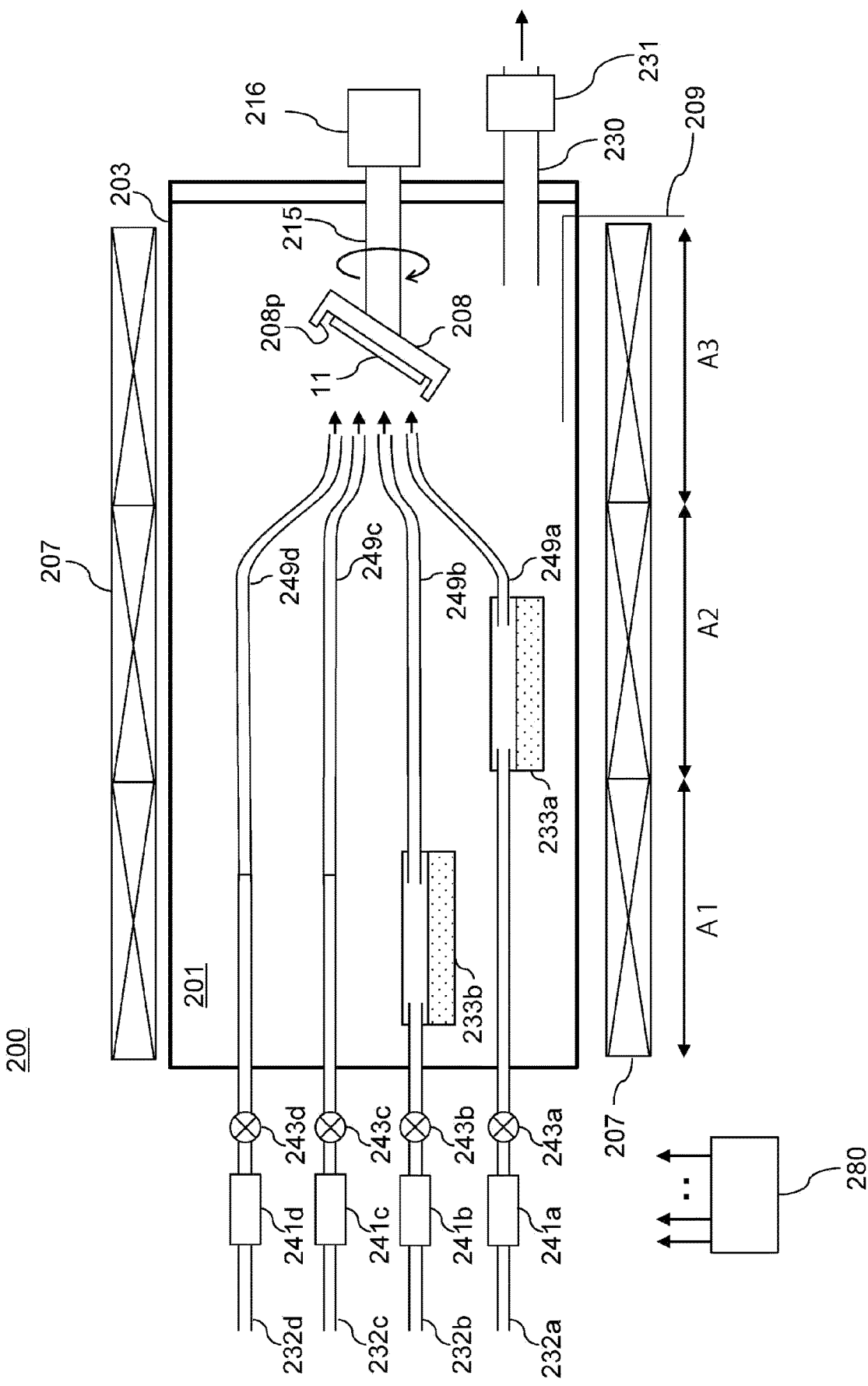
FIG. 3 is a schematic view showing a specific example of a growth apparatus used for manufacturing the nitride semiconductor template according to an embodiment of the present disclosure.

FIG. 3 is a schematic view showing a specific example of the growth apparatus used for manufacturing the nitride semiconductor template of this embodiment.

The example of the figure shows a Hydride Vapor Phase Epitaxy apparatus (HVPE apparatus) as a specific example of the growth apparatus.

A HVPE apparatus 200 includes an airtight container 203 which is made of a heat-resistant material such as quartz or alumina, and which has a film-forming chamber 201 formed therein. A susceptor 208 is provided in the film-forming chamber 201, for holding the substrate 11. The susceptor 208 has a pocket 208p, for housing the substrate 11 with its front surface as an upper side. The susceptor 208 is connected to a rotating shaft 215 of a rotating mechanism 216, and is configured so that the substrate 11 placed on the susceptor 208 is rotatable in a circumferential direction (a direction along a main surface) by a gear provided on a back surface of the susceptor 208 while holding the substrate 11 thereon.

The susceptor 208, the pocket 208p, and the rotating mechanism 216 are preferably constituted of carbon or a carbon coated with SiC, boron nitride (BN), etc., and other members of the HVPE apparatus 200 are preferably constituted of a high-purity quartz containing less impurities. Further, members provided in a region exposed particularly to a high temperature of 1300° C. or more, are preferably constituted of alumina instead of high-purity quartz.

A gas supply pipe 232b for supplying hydrogen chloride (HCl) gas into the film-forming chamber 201, a gas supply pipe 232c for supplying ammonia (NH$_3$) gas into the film-forming chamber 201, and a gas supply pipe 232d for supplying H$_2$ gas, N$_2$ gas, or HCl gas into the film-forming chamber 201, are connected to one end of the airtight container 203. Flow rate controllers 241b to 241d, and valves 243b to 243d, are respectively provided to the gas supply pipes 232b to 232d in this order from an upstream side. A gas generator 233b is provided on a downstream of the gas supply pipe 232b, for housing solid Al as a raw material. A nozzle 249b is connected to the gas generator 233b, for supplying aluminum chloride (AlCl or AlCl$_3$) gas as a film-forming gas generated by a reaction between HCl gas and Al toward the substrate 11 held on the susceptor 208, etc. Nozzles 249c and 249d are respectively connected to downstream sides of the gas supply pipes 232c and 232d, for supplying film-forming gases supplied from these gas supply pipes toward the substrate 11 held on the susceptor 208, etc. Nozzles 249b to 249d are provided so that gases flow toward the front surface of the substrate 11 placed obliquely to a gas flow.

In contrast, an exhaust pipe 230 is provided on the other end of the airtight container 203, for exhausting an inside of the film-forming chamber 201. A pump 231 (or a blower) is provided on the exhaust pipe 230. A zone heater 207 is provided on an outer periphery of the airtight container 203, for heating an inside of the gas generator 233b, the substrate 11 held on the susceptor 208, etc., to a desired temperature. A temperature sensor 209 is provided in the airtight container 203, for measuring a temperature in the film-forming chamber 201. A temperature of the zone heater 207 (referred to as A1 in the figure) located around the gas generator 233b is maintained at a temperature of 600 to 800° C. or 400 to 600° C., to thereby generate AlCl gas or $AlCl_3$ gas by the reaction between HCl gas and Al. Further, a temperature of the zone heater 207 (referred to as A3 in the figure) located around the susceptor 208 is maintained at a temperature suitable for a growth described later.

Each member of the HVPE apparatus 200 is connected to a controller 280 configured as a computer, and is configured so that processing procedures and processing conditions described later are controlled by a program executed by the controller 280.

The HVPE apparatus 200 may include a gas supply pipe 232a for supplying HCl gas into the film-forming chamber 201, a flow rate controller 241a, a valve 243a, a gas generator 233a for housing gallium (Ga) melt or indium (In) melt as a raw material, a nozzle 249a, etc., in addition to the abovementioned each member, and may be constituted so that gallium chloride (GaCl) gas or indium chloride (InCl) gas as the film-forming gas generated by a reaction between HCl gas, and Ga melt or In melt is supplied toward the substrate 11 held on the susceptor 208, etc. Furthermore, the HVPE apparatus 200 may include separate gas generators for housing Ga melt and In melt respectively, and may be constituted so that GaCl gas and InCl gas can be supplied respectively independently.

(An Outline of a Manufacturing Procedure)

Subsequently, an explanation will be given for an example of a manufacturing procedure of a nitride semiconductor template using the HVPE apparatus 200 having abovementioned constitution, in a case that the nitride semiconductor is AlN. Hereafter, the template 10 in a case that AlN is used for the nitride semiconductor, is referred to as "an AlN-template 10".

Figure 4A:
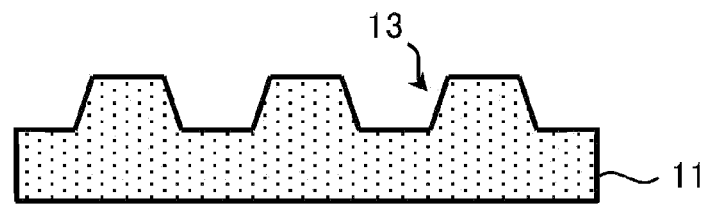
FIGS. 4A, 4B, and 4C are respectively cross-sectional views showing an outline of a manufacturing procedure of the nitride semiconductor template according to an embodiment of the present disclosure.
Figure 4B:
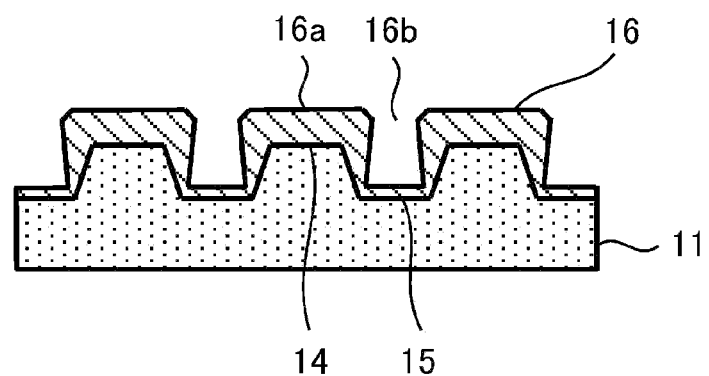
Figure 4C:
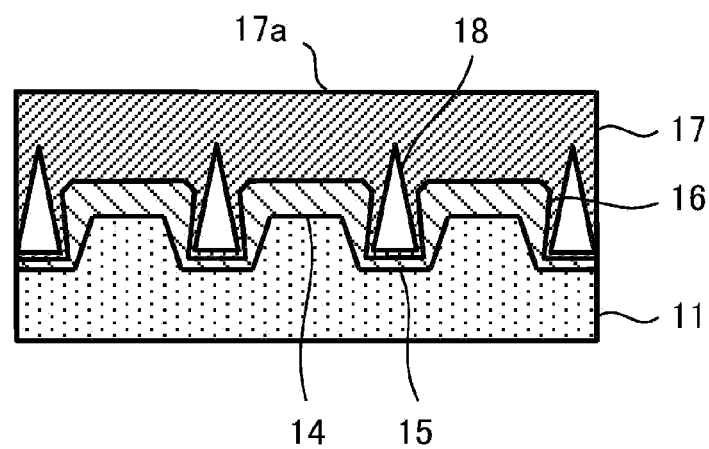

FIGS. 4A, 4B, and 4C are respectively cross-sectional views showing an outline of the manufacturing procedure of the nitride semiconductor template of this embodiment.

The manufacturing of the AlN-template 10 is performed through a substrate preparing step (step 1, step is abbreviated to "S" hereafter), a first layer forming step (S2), an annealing step (S3), and a second layer forming step (S4).

(S1: Substrate Preparing Step)

In the substrate preparing step (S1), the substrate 11 to be processed by the HVPE apparatus 200, namely, the substrate for constituting the AlN-template 10, is prepared. Specifically, as shown in FIG. 4A, the pattern-substrate constituted of the sapphire substrate with the pattern 13 formed on the front surface, is prepared as the substrate 11.

As the substrate 11, the pattern-substrate is prepared, in which the pitch P between adjacent concave portions 15 of the pattern 13 is for example 3 μm or less, more preferably 0.5 to 2 μm which is about a wavelength of a light. When the pitch P is more than 3 μm, the increase of the thickness of the nitride semiconductor layer (an AlN layer) 12 formed on the pattern 13 may be required for flattening its front surface. When the pitch P is in a range of 0.5 to 2 μm, the light-extraction efficiency can be improved in a case of constituting the light emitting device such as LED. Further, a depth of the concave portion 15 (a distance from the upper surface of the convex portion 14 to the bottom surface of the concave portion 15) is preferably not more than each cycle of the cyclical structure for example, and is preferably 400 nm or more in order to sufficiently obtain the effect of the light-extraction efficiency. Further, the diameter of the opening of the concave portion 15 at the same level as the upper surface of the convex portion 14 is preferably about 20 to 60% of the pitch P.

For example, one of substrates having a size with a diameter of 2 to 8 inches is selected as the substrate 11. The size with a diameter called here may be an actual inch-size, and may be a size which is used conventionally such as "2 inches"=50 mm, "6 inches"=150 mm.

(S2: First Layer Forming Step)

Next, the first layer forming step (S2) is performed after the substrate preparing step (S1). In the first layer forming step (S2), first, the substrate 11 prepared in the substrate preparing step (S1), is placed on the susceptor 208 of the HVPE apparatus 200, with the pattern 13 as an upper side.

Further, in the HVPE apparatus 200, solid Al as the raw material is housed in the gas generator 233b. Then, the susceptor 208 is rotated, and $H_2$ gas (or a mixed gas of $H_2$ gas and $N_2$ gas) is supplied from the gas supply pipe 232d into the film-forming chamber 201 while heating and exhausting the inside of the film-forming chamber 201. Thereafter, in a state in which a temperature, a pressure, and an atmosphere in the film-forming chamber 201 reaches a desired growth temperature, a desired growth pressure, and a desired atmosphere, gases are supplied from the gas supply pipes 232b and 232c, and then AlCl gas or $AlCl_3$ gas, and $NH_3$ gas are supplied as the film-forming gases toward the front surface of the substrate 11 placed obliquely to the gas flow. These film-forming gases can also be supplied together with a carrier gas composed of $H_2$ gas, $N_2$ gas, or a mixed gas of them.

As a result, as shown in FIG. 4B, the layer 16 is formed by epitaxially growing AlN on the pattern 13 of the substrate 11 by, the vapor phase growth.

Incidentally, in growing an AlN film using as the layer 16, the AlN film is grown in a vertical direction while forming C-plane ((0001) plane) on the upper surface of the convex portion 14 of the pattern 13, and the AlN film is grown in a lateral direction while forming an oblique facet on the portion facing the bottom surface of the concave portion 15 of the pattern 13.

The layer 16 is grown in a thickness of flattening the front surface and not generating cracks in the layer 16 during the growth and annealing. Specifically, the layer 16 is grown so that the thickness of the layer 16 formed on the upper surface of the convex portion 14 of the pattern 13 is 100 to 800 nm.

Therefore, the layer 16 is formed in a state of not flattening the front surface. More specifically, the layer 16 is formed so as to have a flattened front surface 16a above the upper surface of the convex portion 14 of the pattern 13, meanwhile the layer 16 is formed so as to leave a gap 16b on the portion facing the bottom surface of the concave portion 15 of the pattern 13 without flattening the front surface.

Further, in the first layer forming step (S2), the layer 16 is formed under a condition that the layer 16 is crystallized (namely, in a non-amorphous state) at the time of completion of the growth in the abovementioned thickness (namely, in an as-grown state before annealing). Specifically, for example, the layer 16 is formed by heating using the zone heater 207 (referred to as A3 in FIG. 3) so that the temperature near the susceptor 208 of the HVPE apparatus 200 is maintained at a growth temperature of 1000 to 1300° C. Then, the AlN film for forming the layer 16 is grown by adjusting a supply amount of AlCl gas or $AlCl_3$ gas, and $NH_3$ gas so that a growth rate is 0.5 to 500 nm/minute. A ratio of a supply amount of N-source to Al-source (a so-called V/III ratio) is set as 0.2 to 200. At this time, HCl gas may flow from the nozzle 249*d* in order to prevent a parasitical adhesion of AlN on the nozzles 249*a* to 249*d*, and an amount of HCl gas is set as a ratio of 0.1 to 100 with respect to AlCl gas or $AlCl_3$ gas.

In the layer 16 thus formed, the RMS on the front surface 16*a* facing the upper surface of the convex portion 14 of the pattern 13 is for example about 0.3 to 10 nm at the time of completion of the growth (namely, in the as-grown state before annealing). When AFM measurement is performed to a region of 5 μm×5 μm square in the as-grown state, the gap 16*b* is included in the measurement region. Therefore, when the RMS is calculated, a value larger than 10 nm is sometimes obtained due to an influence of the gap 16*b*. However, the RMS of the front surface 16*a* is important here. Therefore, the RMS at this point is calculated excluding the influence of the gap 16*b*.

Further, the layer 16 has a polarity in a growth direction. For example, in the layer 16, the substrate 11-side surface is N-polarity plane, and most of an opposite-side surface (namely, the front surface of the layer 16) is Al-polarity plane which is the group-III polarity plane.

(S3: Annealing Step)

Incidentally, since the layer 16 is formed to be thin in the abovementioned thickness, there is a concern that a dislocation density of the layer 16 is increased at the time of completion of the growth (namely, in the as-grown state before annealing). Therefore, the annealing step (S3) is performed in order to realize the high-quality thin layer 16 on the substrate 11 after the first layer forming step (S2).

In the annealing step (S3), supplies of AlCl gas or $AlCl_3$ gas, $NH_3$ gas, and $H_2$ gas into the film-forming chamber 201 of the HVPE apparatus 200 are stopped, and $N_2$ gas is supplied from all gas supply pipes, and thereby the atmosphere in the film-forming chamber 201 is replaced with $N_2$ gas. After the atmosphere in the film-forming chamber 201 becomes $N_2$ gas atmosphere, a temperature near the susceptor 208 is elevated to a desired annealing temperature using the zone heater 207 (referred to as A3 in FIG. 3) while rotating the susceptor 208 and exhausting the inside of the film-forming chamber 201. Thus, in the annealing step (S3), annealing is applied to the layer 16 formed on the substrate 11 in $N_2$ gas atmosphere, without unloading the substrate 11 from the inside of the film-forming chamber 201 of the HVPE apparatus 200. Namely, annealing is applied to the layer 16 in $N_2$ gas atmosphere which is an atmosphere not containing AlCl gas or $AlCl_3$ gas, $NH_3$ gas, and $H_2$ gas. By thus applying annealing in $N_2$ gas atmosphere, a mixture of impurities such as carbon (C) and O into the layer 16 during annealing can be suppressed, and annealing using the same HVPE apparatus 200 used in the first layer forming step (S2) can also be realized.

Annealing applied in the annealing step (S3) is a treatment for improving of a quality of a front surface state (particularly, a state relating to the dislocations) of the layer 16. Therefore, in the annealing step (S3), it is preferable to apply annealing under a condition that the average dislocation density on the front surface 16*a* of the layer 16 after annealing becomes $1\times10^9$ numbers/cm² or less. Further, in the annealing step (S3), annealing is applied under a condition that the half-value width of (10-12) diffraction obtained by XRC measurement for the front surface 16*a* of the layer 16 after annealing becomes 600 seconds or less, more preferably 400 seconds or less. This means that annealing is applied under a condition that edge dislocations of the layer 16 are mainly reduced in the annealing step (S3). A case that the average dislocation density is $1\times10^9$ numbers/cm² or less, means that the half-value width of (10-12) diffraction obtained by XRC measurement is approximately 400 seconds or less.

Figure 5A:
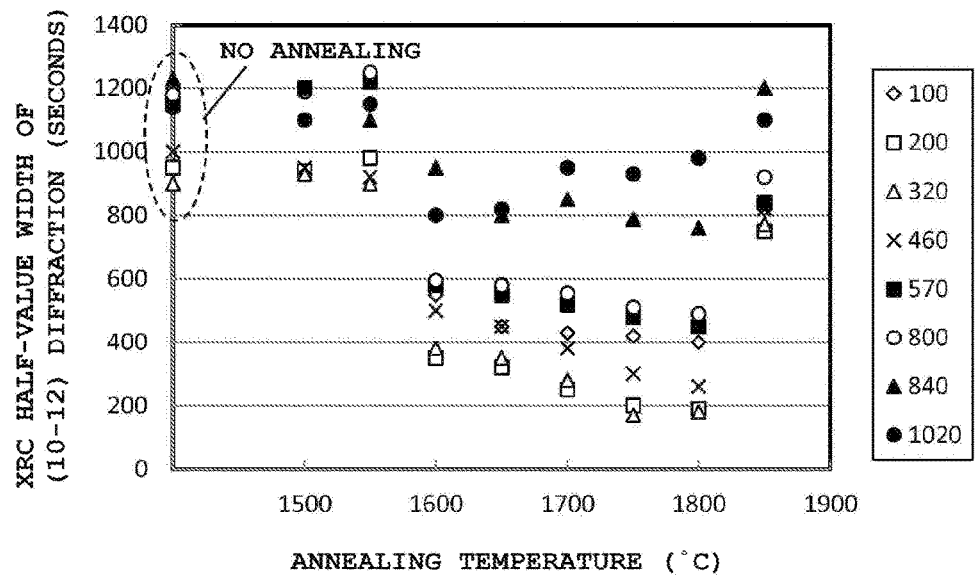
FIGS. 5A and 5B are respectively explanation views showing a specific example of a relation between an annealing condition and a state of dislocations on a front surface of an AlN film constituting a first layer in the nitride semiconductor template according to an embodiment of the present disclosure.
Figure 5B:
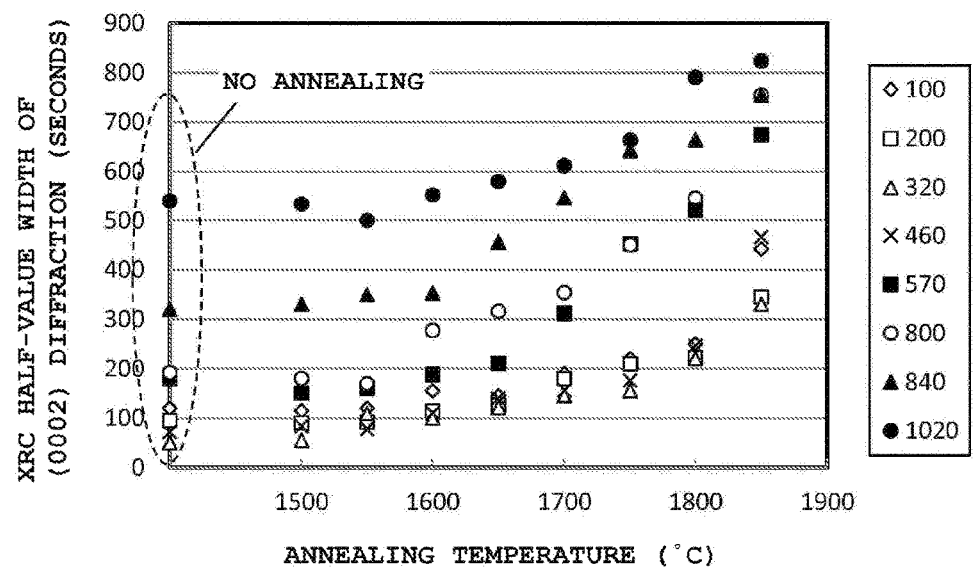

As shown in FIGS. 5A and 5B for example, a state relating to the dislocations (for example, the edge dislocations and screw dislocations) on the front surface of an AlN layer after annealing, depends on a processing temperature (an annealing temperature) when annealing is applied.

FIGS. 5A and 5B are respectively explanation views showing a specific example of a relation between a state of dislocations on the front surface of the AlN film constituting the first layer and the annealing conditions.

The examples of FIG. 5A show specific examples of a relation between a half-value width of (10-12) diffraction obtained by XRC measurement using the XRD apparatus (namely, measurement results of both the edge dislocations and the screw dislocations) and an annealing temperature. The examples of FIG. 5B show specific examples of a relation between a half-value width of (0002) diffraction obtained by the same XRC measurement (namely, measurement results of the screw dislocations) and the annealing temperature. Specifically, the examples of FIGS. 5A and 5B show results obtained by XRC measurement for a wafer having a thickness of the layer 16 being one of 100 nm, 200 nm, 320 nm, 460 nm, 570 nm, 800 nm, 840 nm, and 1020 nm, in a case of not being subjected to annealing and after being taken out from the HVPE apparatus 200 before growing the layer 17, or in a case of being subjected to annealing at the annealing temperature of 1500 to 1850° C. for an annealing time of one hour and after being taken out from the HVPE apparatus 200 immediately after annealing namely before growing the layer 17.

According to the measurement results shown in FIGS. 5A and 5B, in the case of not applying annealing at all, the average dislocation density on the front surface of the layer 16 is equal to or larger than about $1\times10^{10}$ numbers/cm² of the conventional AlN film, and although the half-value width of (0002) diffraction is a small value of about 100 seconds, the half-value width of (10-12) diffraction is a large value of about 1000 seconds.

In contrast, in the case of applying annealing, the half-value width obtained by XRC measurement (also referred to as an XRC half-value width) is changed by annealing particularly at 1600° C. or more. Namely, by applying annealing at 1600° C. or more, the half-value width of (0002) diffraction obtained by XRC measurement is increased and the half-value width of (10-12) diffraction is decreased, as compared with the case of not applying annealing.

Particularly, when the half-value width of (10-12) diffraction is focused, the half-value width is remarkably decreased when the annealing temperature is in a rage of 1600 to 1800° C. Especially, the half-value width of (10-12) diffraction is a small value of 600 seconds or less, when the thickness of the layer 16 is 800 nm or less. Further, the half-value width of (10-12) diffraction is 400 seconds or less, when the annealing temperature is in a range of 1600 to 1800° C. in a case that the thickness of the layer 16 is 320 nm or less, or when the annealing temperature is in a range of 1720 to 1800° C. in a case that the thickness of the layer 16 is 460 nm. Under this condition, it is conceivable that the dislocation density of the layer 16 is $1 \times 10^9$ numbers/cm$^2$ or less when the half-value width of (10-12) diffraction is converted to the dislocation density. The half-value width of (10-12) diffraction is deteriorated to 700 seconds or more when the annealing temperature is 1850° C. or more. It is conceivable that the dislocation density is changed to an increase reversely, as a result of the excessively high annealing temperature.

Almost the same result can be obtained in a case that an annealing time is changed in a range of 30 to 180 minutes.

As described above, in order to realize the abovementioned high-quality layer 16, the annealing step (S3) is performed under the following specific conditions: the thickness of the layer 16 is in a range of 100 to 800 nm, the annealing temperature is in a range of 1600 to 1800° C., and the annealing time is in a range of 30 to 180 minutes, for example.

When the thickness of the layer 16 is less than 100 nm, the front surface of the layer 16 is not flattened after being grown, and the layer 16 is peeled off by etching sapphire of the substrate 11 during annealing. Therefore, a high-quality film is hardly obtained. Further, when the thickness of the layer 16 is more than 800 nm, as shown in FIG. 5B, the half-value width of (0002) diffraction obtained by XRC measurement is hardly 600 seconds or less. This is a phenomenon supporting an idea that the dislocations are reduced by relatively freely moving constituent atoms of AlN during annealing when the thickness of the layer 16 is small described later. Namely, it is possible to explain the following matter: the high-quality AlN film is hardly realized in a case of the large thickness of the layer 16, probably due to a situation in which a degree of freedom of the constituent atoms in AlN is relatively decreased.

When annealing is applied at a temperature of less than 1600° C., an effect by annealing cannot be sufficiently obtained, thereby involving a possibility that the quality of the front surface state of the layer 16 cannot be improved. Meanwhile, annealing at a temperature of 1850° C. or more results in an excessive annealing, and results in a situation that an improvement of the quality of the front surface state of the layer 16 is rather hindered.

This is also applied to the annealing time. Namely, when annealing is applied for less than 30 minutes, the effect by annealing cannot be sufficiently obtained, thereby involving a possibility that the quality of the front surface state of the layer 16 cannot be improved. Meanwhile, annealing for more than 180 minutes results in the excessive annealing, and results in a situation that the improvement of the quality of the front surface state of the layer 16 is rather hindered.

Incidentally, in the annealing step (S3), the front surface of the layer 16 is deteriorated when annealing is applied under a condition that the sufficient high-quality AlN film can be realized. Specifically, the front surface 16a of the layer 16 before annealing and after annealing, is sometimes changed as follows.

For example, regarding the RMS on the front surface 16a of the layer 16, the RMS after the annealing step (S3) is larger than the RMS after the first layer forming step (S2) and before the annealing step (S3). Specifically, above each RMS is changed as follows: the RMS on the front surface 16a of the layer 16 after the first layer forming step (S2) and before the annealing step (S3) is 0.3 to 10 nm, and meanwhile the RMS on the front surface 16a of the layer 16 after the annealing step (S3) is 1 to 50 nm.

Further, for example, regarding a half-value width of (0002) diffraction or (0004) diffraction obtained by XRC measurement for the front surface 16a of the layer 16, the value after the annealing step (S3) is larger than the value after the first layer forming step (S2) and before the annealing step (S3). Specifically, as shown in FIG. 5B, above each value is changed between before and after annealing as follows. Namely, the half-value width of (0002) diffraction or (0004) diffraction obtained by XRC measurement for the front surface 16a of the layer 16 after the first layer forming step (S2) and before the annealing step (S3) is 50 to 200 seconds, when the thickness of the layer 16 is at least 800 nm or less. In contrast, the half-value width of (0002) diffraction or (0004) diffraction obtained by XRC measurement for the front surface 16a of the layer 16 after the annealing step (S3) is 100 to 600 seconds, at the annealing temperature of 1600 to 1800° C.

It is generally considered that an increase of the half-value width of (0002) diffraction or (0004) diffraction indicates an increase of an edge dislocation density. However, this is a discussion mainly in a case of a crystal when a front surface is flattened. A different discussion is possible in a case that the front surface is roughened. Namely, when the front surface is roughened, an additional degree of freedom occurs in an atom position or a direction of a lattice plane on the front surface even when the dislocations do not existed. Therefore, the half-value width of (0002) diffraction or (0004) diffraction is measured to be large in some cases. Accordingly, when the annealing temperature is at least in a range of 1800° C. or less, it is conceivable that the increase of the half-value width of (0002) diffraction shown in FIG. 5B, is not caused by an increase of the dislocation density of the layer 16, but is caused by roughness on the front surface. The following matter also supports this reasoning (the dislocation density after annealing is not increased): namely, the half-value width of (0002) diffraction is recovered almost to the same level as before annealing in a case of flattening the front surface of the layer 17 even when it is grown on the layer 16 only by several 100 nm after annealing as described later.

Thus, the deteriorations such as roughness of the front surface occur in the layer 16, when annealing is applied in $N_2$ gas atmosphere to an extent that the dislocations of the layer 16 are reduced. Therefore, conventionally, annealing has not been applied in $N_2$ gas atmosphere.

A decrease of the dislocation density in AlN and an increase of the surface roughness by annealing indicate that the constituent atoms in AlN or on its front surface move relatively freely during annealing. A dislocation part is originally in a higher energetic state than a perfect crystal, because a large number of dangling-bonds of the constituent atoms exist in the dislocation part. In a state when the constituent atoms of AlN can freely move like the annealing step (S3) of this embodiment, a driving force is generated for eliminating the dislocations so as to lower an energy of the whole crystal.

However, in the state when such constituent atoms can relatively freely move, conventionally, annealing under such a condition is not adopted as a method for reducing the dislocations of AlN because the front surface of AlN is roughened as described above.

However, it is found by the present inventors that even when the front surface 16a of the layer 16 is deteriorated by applying annealing in $N_2$ gas atmosphere, an additional AlN film is grown on the roughened surface under a prescribed condition as described later, and thereby the roughened surface can become a mirror surface, and further an average dislocation density on a re-growing surface can become $1×10^9$ numbers/$cm^2$ or less in the best mode. Therefore, the second layer forming step (S4) for growing the layer 17 so as to overlap on the layer 16 under a prescribed condition, is performed after the annealing step (S3).

When it is desired to suppress the deterioration of the front surface 16a after the abovementioned annealing step (S3), it is preferable to apply annealing in a state of protecting the front surface of the layer 16 after growth in the annealing step (S3). The front surface of the layer 16 is preferably protected by preparing (1) a sapphire substrate not having the pattern 13 shown in FIG. 1, etc., with a mirror surface, (2) the substrate 11 having the layer 16, or (3) a sapphire substrate not having the pattern 13 and having the layer 16, as a means for surface protection, separately from the substrate 11 having the layer 16 to be annealed (annealing substrate 11), and by making the front surface of the layer 16 of the annealing substrate 11 faced with the mirror surface of the substrate of (1), faced with the front surface of the layer 16 of the substrate (2), or faced with the front surface of the layer 16 of the substrate (3). By thus protecting the front surface of the layer 16, although the step is slightly complicated, an increase of the RMS of the front surface 16a of the layer 16 described later can be suppressed even at a stage after the annealing step (S3) and at a stage before the growth of the layer 17.

(S4: Second Layer forming Step)

In the second layer forming step (S4), the susceptor 208 is rotated, and $H_2$ gas (or the mixed gas of $H_2$ gas and $N_2$ gas) is supplied from the gas supply pipe 232d into the film-forming chamber 201 while heating and exhausting the inside of the film-forming chamber 201, without unloading the substrate 11 with the layer 16 formed thereon from the inside of the film-forming chamber 201 of the HVPE apparatus 200. Thereafter, in a state in which a temperature, a pressure, and an atmosphere in the film-forming chamber 201 reaches a desired growth temperature, a desired growth pressure, and a desired atmosphere, gases are supplied from the gas supply pipes 232b and 232c, and then AlCl gas or $AlCl_3$ gas, and $NH_3$ gas are supplied as the film-forming gases toward the front surface of the substrate 11 placed obliquely to a gas flow. These film-forming gases can also be supplied together with the carrier gas composed of $H_2$ gas, $N_2$ gas, or the mixed gas of them.

Thereby, as shown in FIG. 4C, the layer 17 is formed by epitaxially growing AlN on the layer 16 by the vapor phase growth. Thus, by forming the layer 17 by the epitaxial growth of the vapor phase growth, a crystal structure of the layer 17 is formed based on a crystal structure of the layer 16. Namely, since the dislocations of the layer 16 are reduced, the reduced dislocation layer 17 is also formed on the layer 16. Specifically, for example, since the average dislocation density on the front surface 16a of the layer 16 after annealing is $1×10^9$ numbers/$cm^2$ or less in the best mode, the average dislocation density on a front surface 17a of the layer 17 formed on the layer 16 is also $1×10^9$ numbers/$cm^2$ or less in the best mode.

The layer 17 is formed in a thickness of flattening the front surface 17a, for example. Specifically, the layer 17 is formed so that a total thickness of the layer 16 and the layer 17, namely a thickness from the upper surface of the convex portion 14 of the pattern 13 to the front surface (flattening surface) 17a of the layer 17 exceeds at least 800 nm. By thus forming the layer 17 in the thickness of flattening the front surface 17a, the gap 16b in the layer 16 is closed, and the void 18 is remained in the layer 17.

Further, the layer 17 is formed so that the total thickness of the layer 16 and layer 17, namely the thickness from the upper surface of the convex portion 14 of the pattern 13 to the front surface (flattening surface) 17a of the layer 17 is 5 µm or less for example, for suppressing an increase of the thickness of the AlN layer 12 constituted of the layer 16 and the layer 17 as much as possible, and for preventing a generation of the cracks in the AlN layer 12 by suppressing the increase of the thickness of the AlN layer 12.

Further, for example, the layer 17 is formed by heating using the zone heater 207 (referred to as A3 in FIG. 3) so that the temperature near the susceptor 208 of the HVPE apparatus 200 is maintained at a growth temperature of 1000 to 1600° C., more preferably 1400 to 1600° C. Then, the AlN film for forming the layer 17 is grown by adjusting a supply amount of AlCl gas or $AlCl_3$ gas, and $NH_3$ gas so that a growth rate is 0.5 to 500 nm/minute. A ratio of a supply amount of N-source to Al-source (a so-called V/III ratio) is set as 0.2 to 200. At this time, HCl gas may flow from the nozzle 249d in order to prevent the parasitical adhesion of AlN on the nozzles 249a to 249d, and an amount of HCl gas is set as a ratio of 0.1 to 100 with respect to AlCl gas or $AlCl_3$ gas.

The layer 17 thus formed, has the RMS on the front surface 17a of for example 10 nm or less, more preferably 1 nm or less. This indicates that the AlN layer 12 has a RMS on the front surface of for example 10 nm or less, more preferably 1 nm or less.

Further, the layer 17 has the half-value width of 600 seconds or less in (10-12) diffraction obtained by XRC measurement for the front surface 17a. This indicates that the AlN layer 12 has a half-value width of 600 seconds or less in (10-12) diffraction obtained by XRC measurement for the front surface of the AlN layer 12.

Namely, even in a case that the layer 16 is formed in the thickness of not flattening the front surface, the front surface 17a of the layer 17 can be flattened based on an assumption that the dislocations of the layer 16 are reduced, when the layer 17 is grown at the growth temperature of 1000 to 1600° C., particularly 1400 to 1600° C. so that the total thickness of the layer 16 and the layer 17 exceeds at least 800 nm, namely the thickness from the upper surface of the convex portion 14 of the pattern 13 to the front surface (flattening surface) 17a of the layer 17 exceeds at least 800 nm.

In addition, when the total thickness of the layer 16 and the layer 17, namely the thickness from the upper surface of the convex portion 14 of the pattern 13 to the front surface (flattening surface) 17a of the layer 17 is set to 5 µm or less for example, it is possible to suppress the increaseof the thickness of the AlN layer 12, and the cracks are not generated in the AlN layer 12 by suppressing the increase of the thickness of the AlN layer 12. Furthermore, even in a case that the increase of the thickness of the AlN layer 12 is suppressed, the dislocation density on the front surface of the AlN layer 12, namely the front surface 17a of the layer 17 can be $1×10^9$ numbers/$cm^2$ or less in the best mode.

Figure 6A:
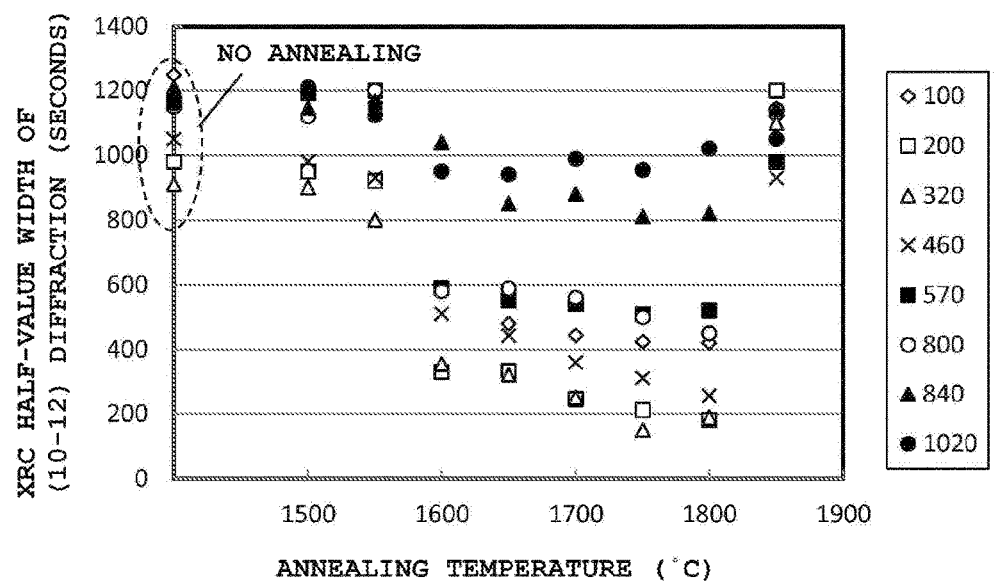
FIGS. 6A and 6B are respectively explanation views showing a specific example of a relation between an annealing condition and a state of dislocations on a front surface of an AlN film constituting a second layer in the nitride semiconductor template according to an embodiment of the present disclosure.
Figure 6B:
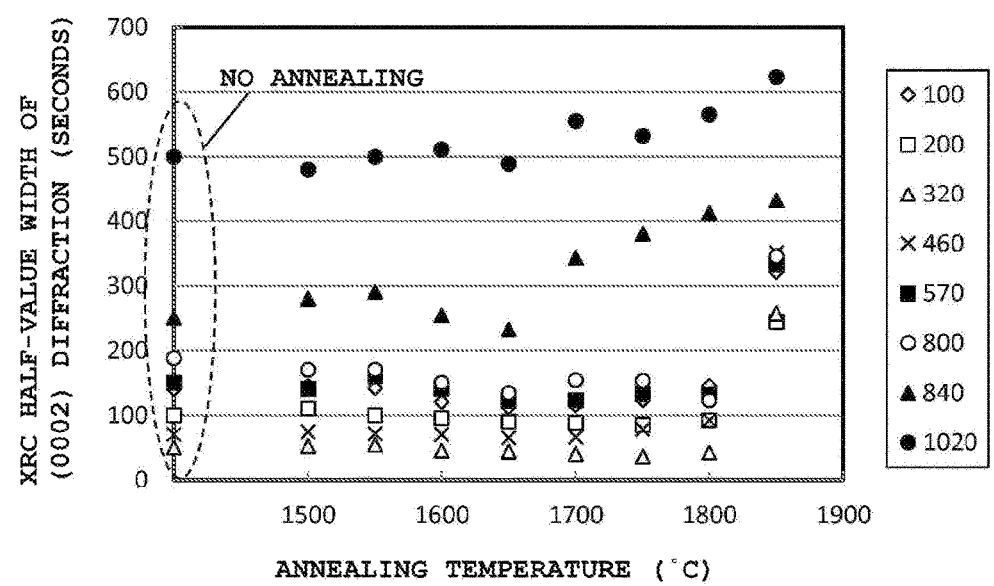

FIGS. 6A and 6B are respectively explanation views showing a specific example of a relation between a state of the dislocations on the front surface of the AlN film constituting the second layer and the annealing condition. Namely, the examples of FIG. 6A show specific examples of a relation between the half-value width of (10-12) diffraction obtained by XRC measurement (namely, measurement results of both the edge dislocations and the screw dislocations) and the annealing temperature. The examples of FIG. 6B show specific examples of a relation between the half-value width of (0002) diffraction obtained by the same XRC measurement (namely, measurement results of the screw dislocations) and the annealing temperature.

The examples of FIGS. 6A and 6B show an XRC half-value width measured after the layer 17 having a thickness of 800 nm is grown on the layer 16. More specifically, the examples of FIGS. 6A and 6B show results obtained by XRC measurement for the layer 17 formed on the layer 16 in a thickness of 800 nm, the layer 16 having a thickness of one of 100 nm, 200 nm, 320 nm, 460 nm, 570 nm, 800 nm, 840 nm, and 1020 nm, in a case of not being subjected to annealing, or in a case of being subjected to annealing at the annealing temperature of 1500 to 1850° C. for an annealing time of one hour.

According to the measurement results shown in FIG. 6A, when the annealing temperature of the layer 16 is in a range of 1600 to 1800° C. and the thickness of the layer 16 is 800 nm or less, the half-value width of (10-12) diffraction obtained by XRC measurement for the front surface of the layer 17 is 600 seconds or less. Further, according to the measurement results shown in FIG. 6B, the half-value width of (0002) diffraction under the above conditions is 200 seconds or less, and it is found that both the edge dislocations and the screw dislocations are suppressed low under these conditions.

Particularly, when the half-value width of (10-12) diffraction is focused, the half-value width of (10-12) diffraction obtained by XRC measurement is 400 seconds or less, and the dislocation density is $1 \times 10^9$ numbers/cm$^2$ or less, in a case that the annealing temperature is in a range of 1600 to 1800° C. and the thickness of the layer 16 is 320 nm or less, and in a case that the annealing temperature is in a range of 1700 to 1800° C. and the thickness of the layer 16 is 460 nm.

Even in a case that the thickness of the layer 17 is changed in a range of 100 nm to 20 µm, almost the same result can be obtained when the front surface of the layer 17 is flattened.

(Flow from S2 to S4)

As described above, in manufacturing the AlN-template 10 in this embodiment, the first layer forming step (S2), the annealing step (S3), and the second layer forming step (S4) are continuously performed using the HVPE apparatus 200 which is the same growth apparatus. Namely, the second layer forming step (S4) is performed without a polishing step of polishing the layer 16 after the annealing step (S3), because the abovementioned steps of S2 to S4 is performed continuously.

Therefore, it is not necessary to prepare the annealing apparatus capable of flowing CO-gas separately from the growth apparatus, even in a case of undergoing the annealing step (S3). Furthermore, since annealing is applied in $N_2$ gas atmosphere, the mixture of impurities such as C and O into particularly the layer 17 which is an upper layer can be suppressed, and annealing using the same HVPE apparatus 200 that performs the vapor phase growth can also be realized.

(Manufactured Product)

The AlN-template 10 of this embodiment as shown in FIG. 1 is manufactured, through the abovementioned steps S1 to S4 respectively.

Such an AlN-template 10 is obtained as follows: the layer 16 is grown on the pattern 13 of the substrate 11 in the thickness of not flattening the front surface 16a, and thereafter annealing is applied at a temperature of 1600 to 1800° C. in $N_2$ gas atmosphere, and then the layer 17 is grown on the layer 16 in the thickness of flattening the front surface 17a. Thereby, the front surface 17a of the layer 17 is flattened and the dislocations of the front surface 17a are reduced. Namely, such an AlN-template 10 having a high-surface quality and a high-crystal quality is realized only by the HVPE apparatus 200 (namely, by simple apparatus configuration not requiring the annealing apparatus, etc., separately from the growth apparatus).

Further, in such an AlN-template 10, the layer 16 and the layer 17 are continuously formed using the same HVPE apparatus 200. However, since there is an increased dislocation density in AlN when the layer 16 is grown, a large amount of oxygen is taken in the layer 16 by diffusion from the substrate 11-side or by mixing from a growth atmosphere during the growth. The oxygen concentration is about $1 \times 10^{18}$ to $1 \times 10^{21}$/cm$^3$. The oxygen concentration of the layer 16 is almost the same as a layer grown using the conventional method, because the layer 16 itself is grown by a conventionally used method. In contrast, the high-quality layer 16 (the reduced dislocation layer 16) to be a base is realized by annealing at the start of the growth of the layer 17, and therefore the layer 17 is also a reduced dislocation AlN. Therefore, although oxygen is slightly diffused from the layer 16 during the growth of the layer 17, the taking-in of oxygen is suppressed as a whole. Although the oxygen concentration of the layer 17 depends on the atmosphere in the growth apparatus, it is typically $1 \times 10^{18}$/cm$^3$ or less.

The AlN-template 10 thus obtained is used for example when a semiconductor device such as LED is manufactured. Namely, the nitride semiconductor device can be constituted by laminating at least one of an n-typed film, a p-typed film, and an undoped film, namely, by forming a nitride semiconductor lamination structure by growing nitride semiconductor containing Al. Such a nitride semiconductor device can realize a schottky diode, a pn-junction diode, a light-emitting diode, or a transistor, for example.

(3) Effect Obtained by this Embodiment

According to this embodiment, one or more of the following effects can be obtained.

(a) According to this embodiment, the AlN layer 12 of the AlN-template 10 is constituted of the two-layer structure of the layer 16 and the layer 17, annealing is applied in $N_2$ gas atmosphere to the layer 16 formed on the pattern 13 of the substrate 11 in the thickness of not flattening the front surface, and thereafter the layer 17 is re-grown on the layer 16 in the thickness of flattening the front surface. Thereby, a high-quality AlN-template 10 can be easily obtained even in a case of forming the pattern 13 on the substrate 11.

(b) In the AlN-template 10 of this embodiment, the AlN layer 12 on the substrate 11 has the two-layer structure of the layer 16 and the layer 17, and both the layer 16 and the layer 17 are formed by the epitaxial growth of the vapor phase growth. Therefore, there is an advantage in terms of increasing the diameter of the AlN-template 10 and ensuring the transparency, as compared with a case of forming the AlN layer 12 by the sublimation method.

(c) Further, in the AlN-template 10 of this embodiment, the dislocations of the layer 16 can be reduced because annealing is applied to the layer 16. In addition, since the dislocations of the layer 16 are reduced, the reduced dislocation layer 17 is also formed on the layer 16. Namely, in the AlN-template 10 of this embodiment, it is not necessary to grow the thick AlN for reducing the dislocations because a reduced dislocation AlN layer 12 is achieved by applying annealing to the layer 16. Therefore, the AlN layer 12 in which the dislocations on the front surface are reduced, can be achieved even when the thickness (the total thickness of the layer 16 and the layer 17) is small as compared with a case of not undergoing annealing, and a risk of generating cracks in the AlN layer 12 can be reduced.

(d) Further, in the AlN-template 10 of this embodiment, the formation thickness of the layer 16 is limited to the thickness of not flattening the front surface in a state of leaving the gap 16b corresponding to the pattern 13 of the substrate 11. Thereby, the generation of the cracks can be suppressed in the layer 16 by relaxing an internal strain in a space formed by the gap 16b of the layer 16 even when annealing is applied to the layer 16.

In addition, in the AlN-template 10 of this embodiment, since the layer 17 is formed in the thickness of flattening the front surface, a flatness of the front surface of the layer 17, namely the front surface of the AlN layer 12 is ensured even in a case of using the substrate 11 having the pattern 13.

(e) Further, in the AlN-template 10 of this embodiment, the thickness of the layer 16 may be limited to the thickness of not flattening the front surface, and the thickness of the layer 17 formed thereon may be a necessary and sufficient thickness for flattening the front surface. Thereby, the thinner AlN layer 12 constituted of the layer 16 and the layer 17 can be realized. In addition, even in such a case, the dislocations on the front surface of the layer 17, namely the front surface of the AlN layer 12 is reduced. Namely, even in a case of realizing the thinner AlN layer 12, an effect of more reduced dislocations on the front surface of the AlN layer 12 can be obtained sufficiently.

(f) Further, in the AlN-template 10 of this embodiment, annealing is applied to the layer 16 in $N_2$ gas atmosphere, the mixture of impurities such as C and O can be suppressed, and it is possible to solve a concern that the purity of the AlN film to be grown is deteriorated.

In addition, in a case of annealing in $N_2$ gas atmosphere, annealing can be applied using the same HVPE apparatus 200 for growing the AlN film. Therefore, it is not necessary to prepare the annealing apparatus separately from the HVPE apparatus 200. Namely, in manufacturing the AlN-template 10, the first layer forming step (S2), the annealing step (S3), and the second layer forming step (S4) can be continuously performed using the HVPE apparatus 200, and therefore the AlN-template 10 can be manufactured extremely efficiently.

(g) Further, in the AlN-template 10 of this embodiment, since the substrate 11 having the pattern 13 is used, the light-extraction efficiency can be improved in a case of constituting a semiconductor device emitting light such as LED for example.

<Other Embodiment>

As described above, explanation has been given specifically for an embodiment of the present disclosure. However, the present disclosure is not limited thereto, and can be variously modified in a range not departing from the gist of the disclosure.

In the abovementioned embodiment, explanation has been given for an example of a case that the nitride semiconductor is AlN, namely in a case that the layer 16 and the layer 17 are made of AlN. However, the present disclosure is not limited thereto. The layer 16 and the layer 17 may be made of the nitride semiconductor containing Al, for example, AlN, AlInN, AlGaN, or AlInGaN which are represented by $In_{1-x-y}Al_xGa_yN$ ($0 \le x+y \le 1$, $0 < x \le 1$, $0 \le y \le 1$), respectively. In this case as well, similar results as the example of the abovementioned embodiment can be obtained.

Further, in the abovementioned embodiment, explanation has been given for an example of a case that the pattern 13 of the substrate 11 is constituted so that the upper surfaces of the convex portions 14 of the pattern 13 form the continuous flat surface. However, the present disclosures is not limited thereto. For example, the concavo-convex pattern may be constituted so that tops of the convex portions are formed into pointed shapes and the bottom surfaces of the concave portions form the continuous flat surface, as long as the concavo-convex pattern has the two-dimensional cyclical structure of convex portions and the concave portions.

Figure 7:
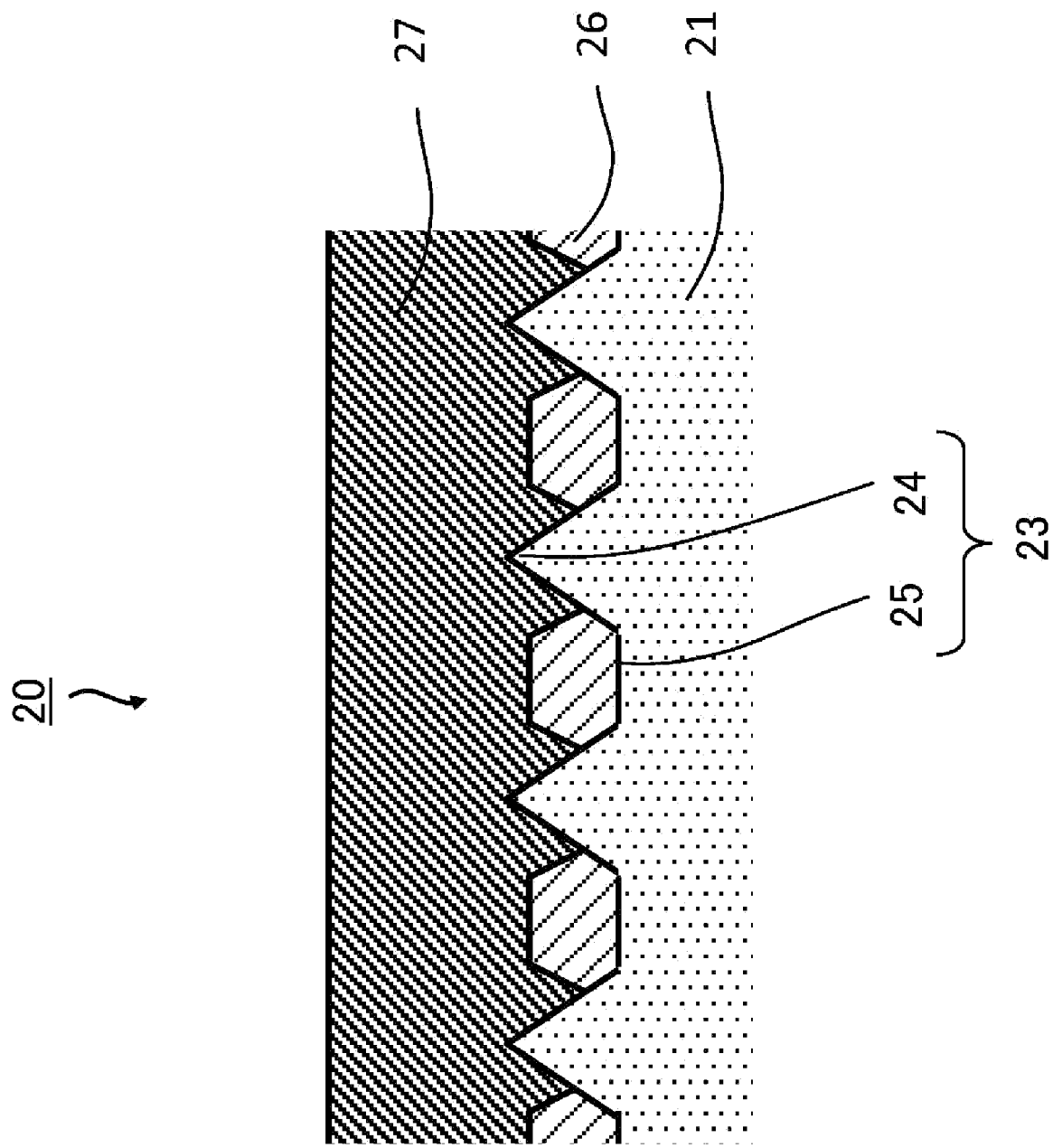
FIG. 7 is a cross-sectional view showing a schematic constitution example of a nitride semiconductor template according to other embodiment of the present disclosure.

FIG. 7 is a cross-sectional view showing a schematic constitution example of the nitride semiconductor template of other embodiment of the present disclosure.

In a nitride semiconductor template 20 shown in the example of the figure, a concavo-convex pattern 23 of a substrate 21 is constituted so that tops of convex portions 24 are formed into pointed shapes, and bottom surfaces of concave portions 25 form a continuous flat surface. Further, the nitride semiconductor template 20 is constituted so that the flat surface of the concavo-convex pattern 23 is used as a front surface of the substrate 21. It is preferable that a pitch P between the tops of the adjacent convex portions 24 in the concavo-convex pattern 23 is set to for example 3 μm or less, more preferably 0.5 to 2 μm which is about a wavelength of light. When the pitch P is more than 3 μm, an increase of a thickness of a nitride semiconductor layer containing Al may be required for flattening the front surface of the nitride semiconductor layer formed on the concavo-convex pattern 23. When the pitch P is in a range of 0.5 to 2 μm, the light-extraction efficiency can be improved in a case of constituting the light emitting device such as LED. Further, a height of the convex portion 24 (a distance from the top of the convex portion 24 to the bottom surface of the concave portion 25) is preferably not more than each cycle of a cyclical structure for example. The height of the convex portion 24 is preferably 400 nm or less in order to sufficiently obtain the light-extraction efficiency. Further, the convex portion 24 is preferably formed into a cone or a polygonal pyramid such as a trigonal pyramid, a quadrangular pyramid, or a hexagonal pyramid. A dimension of a bottom surface of the convex portion 24 at the same level as the bottom surface of the concave portion 25 is preferably about 20 to 60% of the pitch P.

When the substrate 21 having such a concavo-convex pattern 23 is used, in the first layer forming step (S2), a first layer 26 is formed so that the first layer 26 in the bottom surface of the concave portion 25 of the concave-convex pattern 23 has a thickness of forming the first layer 26 as a continuous film and not allowing cracks to be generated in the first layer 26. In this case, since a flat surface does not exist at an upper most portion of the convex portion 24, the first layer 26 is grown mainly on the bottom surface of the concave portion 25. Depending on growth conditions, as shown in FIG. 7, it is possible to grow the nitride semiconductor film containing Al so that it is hardly adhered on the top portion or a slant surface of the convex portion 24. In this case, the first layer 26 is formed into the perforated continuous film covering the bottom surface of the concave portion 25 forming a continuous flat surface. Even in such a case, the first layer 26 is formed so as to have a thickness of not flattening a front surface of the first layer 26, namely so as to leave the concavo-convex portions corresponding to the concave-convex pattern 23.

Further, after annealing is applied to the first layer 26 in the annealing step (S3), in the second layer forming step (S4), a second layer 27 is formed so as to overlap on the first layer 26, in a thickness of flattening a front surface of the second layer 27. In a case of such a growth of the second layer 27, the void 18 as shown in FIG. 4C, etc., is not formed.

In a case of the nitride semiconductor template 20 having such a constitution, the void 18 is not included in the template 20. Therefore, although an effect of suppressing the generation of cracks is slightly deteriorated as compared with the constitution as shown in FIG. 4C, etc., almost the same technical effects as the template 10 described in the above embodiment can be obtained.

Further, in the abovementioned embodiment, explanation has been given for an example of a case that the pattern 13 of the substrate 11 has the six-fold symmetry in a planar view. However, the present disclosure is not limited thereto. Namely, a constitution of the concavo-convex pattern in a planar view is not particularly limited, as long as the concavo-convex pattern has the two-dimensional cyclical structure of the convex portions and the concavo portions.

Further, in the abovementioned embodiment, explanation has been given for an example of a case that annealing is applied in $N_2$ gas atmosphere in the annealing step (S3). However, the present disclosure is not limited thereto. Namely, annealing in the annealing step (S3) may be applied using an inert gas such as argon, helium for example different from $N_2$ gas instead of $N_2$ gas, as long as annealing is applied to the layer 16 in an atmosphere not containing GaCl gas, $GaCl_3$ gas, AlCl gas, $AlCl_3$ gas, InCl gas, $InCl_3$ gas, HCl gas, $Cl_2$ gas, $NH_3$ gas, and $H_2$ gas. In this case as well, similar technical effects as the case of the abovementioned embodiment can be obtained.

Further, in the abovementioned embodiment, explanation has been given for a case that the substrate 11 is a sapphire substrate. However, the present disclosure is not limited thereto. For example, the substrate 11 may be SiC substrate, etc. However, when the substrate 11 is SiC substrate, an optimum annealing temperature in the annealing step (S3) is in a range of 1600 to 2000° C.

Further, the front surface of the substrate 11 is not limited to C-plane, and may be R-plane, A-plane, or M-plane, or may be a surface inclined by 0.1 to 3° from these planes.

Further, in the abovementioned embodiment, explanation has been given for a case that gases flow toward the front surface of substrate 11 placed obliquely to a gas flow in the HVPE apparatus 200. However, gases may flow in a direction along the main surface (in a direction parallel to the main surface) of the substrate 11, or in a direction perpendicular to the main surface of the substrate 11.

Further, in the abovementioned embodiment, explanation has been given for an example of a case that the template 10 is manufactured using the HVPE apparatus 200. However, the present disclosure is not limited thereto. Namely, the growth apparatus used for manufacturing the template 10 may be other vapor phase growth apparatus such as a MOVPE apparatus, or a growth apparatus used in a method other than the vapor phase growth method such as sputtering method or sodium flux method, as long as the layer 16 and the layer 17 can be formed by the epitaxial growth. In this case as well, similar technical effects as the case of the abovementioned embodiment can be obtained.

Further, in the abovementioned embodiment, explanation has been given for an example of the case that the first layer forming step (S2), the annealing step (S3), and the second layer forming step (S4) are performed continuously using the same HVPE apparatus 200. However, the present disclosure is not limited thereto. Namely, all of the first layer forming step (S2), the annealing step (S3), and the second layer forming step (S4) may be performed using different apparatus, or two steps of the abovementioned steps may be performed using the same growth apparatus. For example, it is sometimes rather preferable that the annealing step (S3) is performed using an apparatus separately from the growth apparatus used in the first layer forming step (S2), etc., in a case of protecting the front surface of the nitride semiconductor layer containing Al for the purpose of preventing the roughness on the front surface, as described above.

<Preferable Aspects of the Present Disclosure>

Preferable aspects of the present disclosure will be supplementarily described hereafter.

[Supplementary Description 1]

According to an aspect of the present disclosure, there is provided a method for manufacturing a nitride semiconductor template constituted by forming a nitride semiconductor layer on a substrate, including:

a preparing step of preparing a pattern-substrate as the substrate, with a concavo-convex pattern formed on a front surface;

a first layer forming step of forming a first layer by epitaxially growing a nitride semiconductor containing aluminum on the concavo-convex pattern of the pattern-substrate, in a thickness of not flattening a front surface;

an annealing step of applying annealing to the first layer; and a second layer forming step of forming a second layer by epitaxially growing a nitride semiconductor containing aluminum so as to overlap on the first layer after the annealing step, and in a thickness of flattening a front surface, and constituting the nitride semiconductor layer by the first layer and the second layer.

[Supplementary Description 2]

Preferably, there is provided the method of the supplementary description 1, wherein in the first layer forming step, the first layer is formed on the pattern-substrate constituted so that upper surfaces of convex portions of the concavo-convex pattern form a continuous flat surface, and is formed so that the first layer in the upper surface of the convex portion of the concavo-convex pattern has a thickness of forming the first layer as a continuous film and not allowing cracks to be generated in the first layer.

[Supplementary Description 3]

Preferably, there is provided the method of the supplementary description 1, wherein in the first layer forming step, the first layer is formed on the pattern-substrate constituted so that bottom surfaces of concave portions of the concavo-convex pattern form a continuous flat surface, and is formed so that the first layer in the bottom surface of the concave portion of the concavo-convex pattern has a thickness of forming the first layer as a continuous film and not allowing cracks to be generated in the first layer.

[Supplementary Description 4]

Preferably, there is provided the method of any one of the supplementary descriptions 1 to 3, wherein in the first layer forming step, the first layer is formed so that the thickness of the first layer is 100 to 800 nm.
[Supplementary Description 5]
Preferably, there is provided the method of any one of the supplementary descriptions 1 to 4, wherein in the first layer forming step, the first layer is formed under a condition that the first layer is crystallized (the first layer becomes in a non-amorphous state) at the time of completion of growth (in an as-grown state before annealing).
[Supplementary Description 6]
Preferably, there is provided the method of the supplementary description 5, wherein in the first layer forming step, the first layer is formed at a growth temperature of 1000 to 1300° C.
[Supplementary Description 7]
Preferably, there is provided the method of any one of the supplementary descriptions 1 to 6, wherein in the annealing step, annealing is applied under a condition that an average dislocation density on the front surface of the first layer after the annealing step becomes $1 \times 10^9$ numbers/cm$^2$ or less.
[Supplementary Description 8]
Preferably, there is provided the method of any one of the supplementary descriptions 1 to 7, wherein in the annealing step, annealing is applied under a condition that a half-value width of (10-12) diffraction obtained by X-ray rocking curve measurement for the front surface of the first layer after annealing becomes 600 seconds or less.
[Supplementary Description 9]
More preferably, there is provided the method of the supplementary description 8, wherein annealing is applied under a condition that the half-value width becomes 400 seconds or less.
[Supplementary Description 10]
Preferably, there is provided the method of any one of the supplementary descriptions 1 to 9, wherein in the annealing step, annealing is applied under a condition that edge dislocations of the first layer are reduced.
[Supplementary Description 11]
Preferably, there is provided the method of any one of the supplementary descriptions 1 to 10, wherein the pattern-substrate is a sapphire substrate, and in the annealing step, annealing is applied within a temperature range of 1600 to 1800° C.
[Supplementary Description 12]
Preferably, there is provided the method of any one of the supplementary descriptions 1 to 10, wherein the pattern-substrate is SiC substrate, and in the annealing step, annealing is applied within a temperature range of 1600 to 2000° C.
[Supplementary Description 13]
Preferably, there is provided the method of any one of the supplementary descriptions 1 to 12, wherein in the annealing step, annealing is applied for 30 to 180 minutes.
[Supplementary Description 14]
Preferably, there is provided the method of any one of the supplementary descriptions 1 to 13, wherein in the second layer forming step, the second layer is formed under a condition that a surface roughness RMS of the second layer is 10 nm or less.
A surface roughness RMS is a value obtained by analyzing an image having a size of 5 μm×5 μm using an atomic force microscope.
[Supplementary description 15]
More preferably, there is provided the method of the supplementary description 14, wherein the surface roughness RMS of the second layer is set to 1 nm or less.

[Supplementary Description 16]
Preferably, there is provided the method of any one of the supplementary descriptions 1 to 15, wherein in the second layer forming step, the second layer is formed at a growth temperature of 1000 to 1600° C.
[Supplementary Description 17]
Preferably, there is provided the method of any one of the supplementary descriptions 1 to 16, wherein in the second layer forming step, the second layer is formed so that a total thickness of the first layer and the second layer is 5 μm or less.
[Supplementary Description 18]
Preferably, there is provided the method of any one of the supplementary descriptions 1 to 17, wherein in the annealing step, annealing is applied in nitrogen gas atmosphere.
[Supplementary Description 19]
Preferably, there is provided the method of the supplementary description 18, wherein in the annealing step, annealing is applied in an atmosphere not containing hydrogen gas and ammonia gas.
[Supplementary Description 20]
Preferably, there is provided the method of the supplementary description 18 or 19, wherein in the annealing step, annealing is applied using an inert gas (argon, helium, etc.) different from nitrogen gas instead of nitrogen gas.
[Supplementary Description 21]
Preferably, there is provided the method of any one of the supplementary descriptions 18 to 20, wherein the first layer forming step, the annealing step, and the second layer forming step are continuously performed using the same growth apparatus.
[Supplementary Description 22]
Preferably, there is provided the method of the supplementary description 21, wherein the second layer forming step is performed without interposing a step of polishing the first layer, after the annealing step.
[Supplementary description 23]
Preferably, there is provided the method of any one of the supplementary descriptions 18 to 20, wherein all of the first layer forming step, the annealing step, and the second layer forming step are performed using different apparatus, or two steps of the first layer forming step, the annealing step, and the second layer forming step are performed using the same growth apparatus.
[Supplementary Description 24]
Preferably, there is provided the method of any one of the supplementary descriptions 18 to 21, wherein in the annealing step after the first layer forming step, annealing is applied in a state of protecting the front surface of the first layer after growth.
[Supplementary Description 25]
According to another aspect of the present disclosure, there is provided a nitride semiconductor template having a nitride semiconductor layer formed on a substrate, wherein
the substrate is a pattern-substrate having a concavo-convex pattern formed on a front surface,
the nitride semiconductor layer including:
a first layer formed on the concavo-convex pattern of the pattern-substrate, in a thickness of not flattening a front surface, and made of a nitride semiconductor containing aluminum; and
a second layer formed so as to overlap on the first layer, in a thickness of flattening a front surface, and made of a nitride semiconductor containing aluminum.
[Supplementary Description 26]
Preferably, there is provided the template of the supplementary description 25, wherein the pattern-substrate is constituted so that upper surfaces of convex portions of the concavo-convex pattern form a continuous flat surface.

[Supplementary Description 27]

Preferably, there is provided the template of the supplementary description 25, wherein the pattern-substrate is constituted so that bottom surfaces of concave portions of the concavo-convex pattern form a continuous flat surface.

[Supplementary Description 28]

Preferably, there is provided the template of any one of the supplementary descriptions 25 to 27, wherein the concavo-convex pattern of the pattern-substrate has a two-dimensional cyclical structure.

[Supplementary Description 29]

Preferably, there is provided the template of the supplementary description 28, wherein each cycle of the cyclical structure is 3 μm or less.

[Supplementary Description 30]

Preferably, there is provided the template of the supplementary description 28 or 29, wherein a depth of the concave portion of the concavo-convex pattern is not more than each cycle of the cyclical structure.

[Supplementary Description 31]

Preferably, there is provided the template of any one of the supplementary descriptions 28 to 30, wherein the concavo-convex pattern is formed into a pattern having a symmetry in a planar view.

[Supplementary Description 32]

Preferably, there is provided the template of any one of the supplementary descriptions 25 to 31, wherein the nitride semiconductor layer has a thickness of 5 μm or less from the upper surface of the convex portion or the bottom surface of the concave portion of the concavo-convex pattern forming the continuous flat surface, to a front surface of the nitride semiconductor layer.

[Supplementary Description 33]

Preferably, there is provided the template of any one of the supplementary descriptions 25 to 32, wherein the nitride semiconductor layer has a half-value width of 600 seconds or less in (10-12) diffraction obtained by X-ray rocking curve measurement for the front surface.

[Supplementary Description 34]

Preferably, there is provided the template of any one of the supplementary descriptions 25 to 33, wherein the nitride semiconductor layer has an average dislocation density of $1 \times 10^9$ numbers/cm$^2$ or less on the front surface.

[Supplementary Description 35]

Preferably, there is provided the template of any one of the supplementary descriptions 25 to 34, wherein the nitride semiconductor layer has a surface roughness RMS of 10 nm or less on the front surface.

[Supplementary Description 36]

Preferably, there is provided the template of any one of the supplementary descriptions 25 to 35, wherein the first layer and the second layer are made of aluminum nitride, indium aluminum nitride, aluminum gallium nitride, or aluminum gallium indium nitride which are represented by $In_{1-x-y}Al_xGa_yN$ (0≤x+y≤1, 0<x≤1, 0≤y≤1).

[Supplementary Description 37]

According to further another aspect of the present disclosure, there is provided a nitride semiconductor device, including:

the nitride semiconductor template of any one of the supplementary descriptions 25 to 36; and a nitride semiconductor lamination structure grown and formed on the nitride semiconductor template.

[Supplementary Description 38]

Preferably, there is provided the device of the supplementary description 37, wherein the nitride semiconductor lamination structure is constituted of a multilayer film of an n-typed film, a p-typed film, or an undoped film which are represented by $In_{1-x-y}Al_xGa_yN$ (0≤x+y≤1, 0<x≤1, 0≤y≤1), and realizes a schottky diode, a pn-junction diode, a light-emitting diode, or a transistor.

What is claimed is:

1. A nitride semiconductor template, comprising:
   a substrate having a plurality of convex portions formed into a cone or a polygonal pyramid on a main surface, the convex portions being arranged to create a six-fold symmetry pattern; and
   a nitride semiconductor layer having:
      a first layer formed on the main surface of the substrate, and having a thickness that does not flatten a front surface of the first layer, and made of a nitride semiconductor containing aluminum; and
      a second layer formed so as to overlap on the first layer, and having a thickness that flattens a front surface of the second layer, and made of a nitride semiconductor containing aluminum,
   wherein the main surface of the substrate is constituted as a continuous flat surface in a region excluding the convex portions,
   the first layer is constituted as a continuous film on the continuous flat surface of the substrate, and is not formed on a top of the convex portion and at least on a top-side surface of a slope of the convex portion,
   an average dislocation density on the front surface of the first layer on the continuous flat surface of the substrate is $1 \times 10^9$ numbers/cm$^2$ or less,
   the first layer and the second layer contain oxygen as an impurity,
   the first layer and the second layer have different oxygen concentrations, and
   the nitride semiconductor layer has a thickness of 5 μm or less from an upper surface of the continuous flat surface of the substrate to a front surface of the nitride semiconductor layer.

2. The nitride semiconductor template according to claim 1, wherein the first layer on the continuous flat surface of the substrate has a thickness of more than 100 nm and 800 nm or less.

3. A nitride semiconductor device, comprising:
   the nitride semiconductor template of claim 1; and
   a nitride semiconductor lamination structure grown and formed on the nitride semiconductor template.

4. The nitride semiconductor template according to claim 1, wherein the nitride semiconductor layer has a thickness of more than 800 nm from an upper surface of the continuous flat surface of the substrate to a front surface of the nitride semiconductor layer.

5. The nitride semiconductor template according to claim 1, wherein the second layer has a lower oxygen concentration than the oxygen concentration in the first layer.

* * * * *